United States Patent
Ashida et al.

(10) Patent No.: US 11,522,259 B2
(45) Date of Patent: *Dec. 6, 2022

(54) MULTILAYERED FILTER DEVICE

(71) Applicant: TDK CORPORATION, Tokyo (JP)

(72) Inventors: Yuta Ashida, Tokyo (JP); Noriyuki Hirabayashi, Tokyo (JP); Shigemitsu Tomaki, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/362,140

(22) Filed: Jun. 29, 2021

(65) Prior Publication Data

US 2021/0328317 A1    Oct. 21, 2021

Related U.S. Application Data

(63) Continuation of application No. 16/816,929, filed on Mar. 12, 2020, now Pat. No. 11,081,767.

(30) Foreign Application Priority Data

Mar. 18, 2019    (JP) .............................. JP2019-050314

(51) Int. Cl.
*H01P 1/203*    (2006.01)
*H03H 7/01*    (2006.01)
*H01P 1/205*    (2006.01)
*H03H 1/00*    (2006.01)

(52) U.S. Cl.
CPC .......... *H01P 1/20345* (2013.01); *H01P 1/203* (2013.01); *H01P 1/2056* (2013.01); *H03H 7/0138* (2013.01); *H03H 2001/0085* (2013.01)

(58) Field of Classification Search
CPC ........ H01P 1/20; H01P 1/203; H01P 1/20345; H03H 2001/0085
USPC ................................ 333/175, 185, 204, 205
See application file for complete search history.

(56) References Cited

U.S. PATENT DOCUMENTS

| 5,949,304 A | 9/1999 | Heine et al. | |
|---|---|---|---|
| 11,081,767 B2 * | 8/2021 | Ashida | ............... H01P 1/20345 |
| 2018/0062232 A1 | 3/2018 | Chieh et al. | |
| 2019/0007018 A1 | 1/2019 | Ashida et al. | |

FOREIGN PATENT DOCUMENTS

JP    2003-008385 A    1/2003

OTHER PUBLICATIONS

Nov. 12, 2020 Office Action Issued in U.S. Appl. No. 16/816,929.
Apr. 1, 2021 Notice of Allowance issued in U.S. Appl. No. 16/816,929.

* cited by examiner

*Primary Examiner* — Rakesh B Patel
(74) *Attorney, Agent, or Firm* — Oliff PLC

(57) ABSTRACT

A multilayered filter device includes a multilayer stack, a band pass filter, a first band elimination filter, and a second band elimination filter. The band pass filter and the first and second band elimination filters are each constructed using the multilayer stack. The band pass filter includes a plurality of first resonators with open ends. Each band elimination filter includes a connection path, and a second resonator coupled to the connection path. The connection path includes an impedance transformer. The second resonator includes a conductor line constituting a distributed constant line.

25 Claims, 18 Drawing Sheets

MULTILAYERED FILTER DEVICE

This application is a continuation of U.S. application Ser. No. 16/816,929, filed on Mar. 12, 2020, which claims priority to Japanese Application No. 2019-050314, filed on Mar. 18, 2019, the disclosures of each of which are hereby incorporated by reference in their entirety.

BACKGROUND OF THE INVENTION

1. Field of the Invention

The present invention relates to a multilayered filter device including a band pass filter.

2. Description of the Related Art

The standardization of fifth-generation mobile communication systems (hereinafter referred to as 5G) is currently ongoing. For 5G, the use of frequency bands of 10 GHz or higher, particularly a quasi-millimeter wave band of 10 to 30 GHz and a millimeter wave band of 30 to 300 GHz, is being studied to expand the frequency band.

Some electronic components for use in communication apparatuses are provided with filters and constructed using a multilayer stack. The multilayer stack includes a plurality of dielectric layers and a plurality of conductive layers stacked together. Hereinafter, an electronic component provided with a filter and constructed using a multilayer stack will be referred to as a multilayered filter device. For example, JP 2003-008385A and US 2019/0007018A1 describe such multilayered filter devices.

JP 2003-008385A describes a multilayered filter device including a low-pass filter, a high-pass filter, and band elimination filters.

US 2019/0007018A1 describes a multilayered filter device including first and second band elimination filters and a band pass filter. The band pass filter includes two resonators configured to be electromagnetically coupled to each other, and an inductor. In the multilayered filter device described in US 2019/0007018A1, the two resonators of the band pass filter are formed of different portions of a single conductor layer. Through holes forming the inductor are connected to the conductor layer.

Disadvantages of the multilayered filter device with a band pass filter including a resonator or resonators will be discussed below. If through holes are connected to the conductor layer(s) forming the resonator(s), variations in the characteristics of the band pass filter are likely to occur due to variations in the shapes and/or positions of the conductor layer(s) and the through holes.

Furthermore, the conductor layer(s) forming a resonator or resonators in the multilayered filter device can have a harmonic resonance mode, which is a resonance mode of a harmonic, as well as a basic resonance mode having a basic resonance frequency which determines the passband of the band pass filter. In such a case, the multilayered filter device suffers degradation in the attenuation characteristic in a frequency region higher than the passband of the band pass filter.

SUMMARY OF THE INVENTION

It is an object of the present invention to provide a multilayered filter device including a band pass filter, the multilayered filter device being capable of reducing or eliminating variations in the characteristics of the band pass filter and preventing degradation in the attenuation characteristic in a frequency region higher than the passband of the band pass filter.

A multilayered filter device of the present invention includes: a multilayer stack including a plurality of dielectric layers and a plurality of conductor layers stacked together; a first input/output port and a second input/output port integrated with the multilayer stack; and a band pass filter and a band elimination filter each constructed using the multilayer stack and provided between the first input/output port and the second input/output port in circuit configuration.

The band pass filter includes at least one first resonator with open ends. The band elimination filter includes a first input/output, a second input/output, a connection path connecting the first input/output and the second input/output, and a second resonator coupled to the connection path. The connection path includes an impedance transformer. The second resonator includes a conductor line constituting a distributed constant line.

In the multilayered filter device of the present invention, the band elimination filter may cause an insertion loss at a frequency twice as high as the center frequency of the passband of the band pass filter to be higher than in the case without the band elimination filter in the frequency response of insertion loss between the first input/output port and the second input/output port.

In the multilayered filter device of the present invention, the impedance transformer may include a through hole line portion. The through hole line portion includes at least one through hole provided in the multilayer stack.

In the multilayered filter device of the present invention, the conductor line may have a first end directly connected to the connection path, and a second end farthest from the connection path in circuit configuration. In such a case, the second end of the conductor line may be open.

In the multilayered filter device of the present invention, the band pass filter may include, as the at least one first resonator, a plurality of first resonators configured so that every two of the first resonators adjacent to each other in circuit configuration are electromagnetically coupled to each other. Each of the plurality of first resonators may include a resonator conductor portion formed of a line of conductor. The resonator conductor portion may include a first end and a second end which are opposite ends of the line and are open.

The plurality of first resonators may include a first input/output stage resonator closest to the first input/output port in circuit configuration, a second input/output stage resonator closest to the second input/output port in circuit configuration, and at least one middle resonator located between the first input/output stage resonator and the second input/output stage resonator in circuit configuration. In such a case, the first and second input/output stage resonators may each be smaller in length of the shortest path connecting the first end and the second end of the resonator conductor portion than the at least one middle resonator.

According to the multilayered filter device of the present invention, the band pass filter constructed using the multilayer stack includes at least one first resonator with open ends. This makes it possible to reduce or eliminate variations in the characteristics of the band-pass filter. Furthermore, the provision of the band elimination filter constructed using the multilayer stack makes it possible to prevent degradation in the attenuation characteristic in a frequency region higher than the passband of the band pass filter.

Other and further objects, features and advantages of the invention will appear more fully from the following description.

DETAILED DESCRIPTION OF THE PREFERRED EMBODIMENTS

First Embodiment

Figure 1:
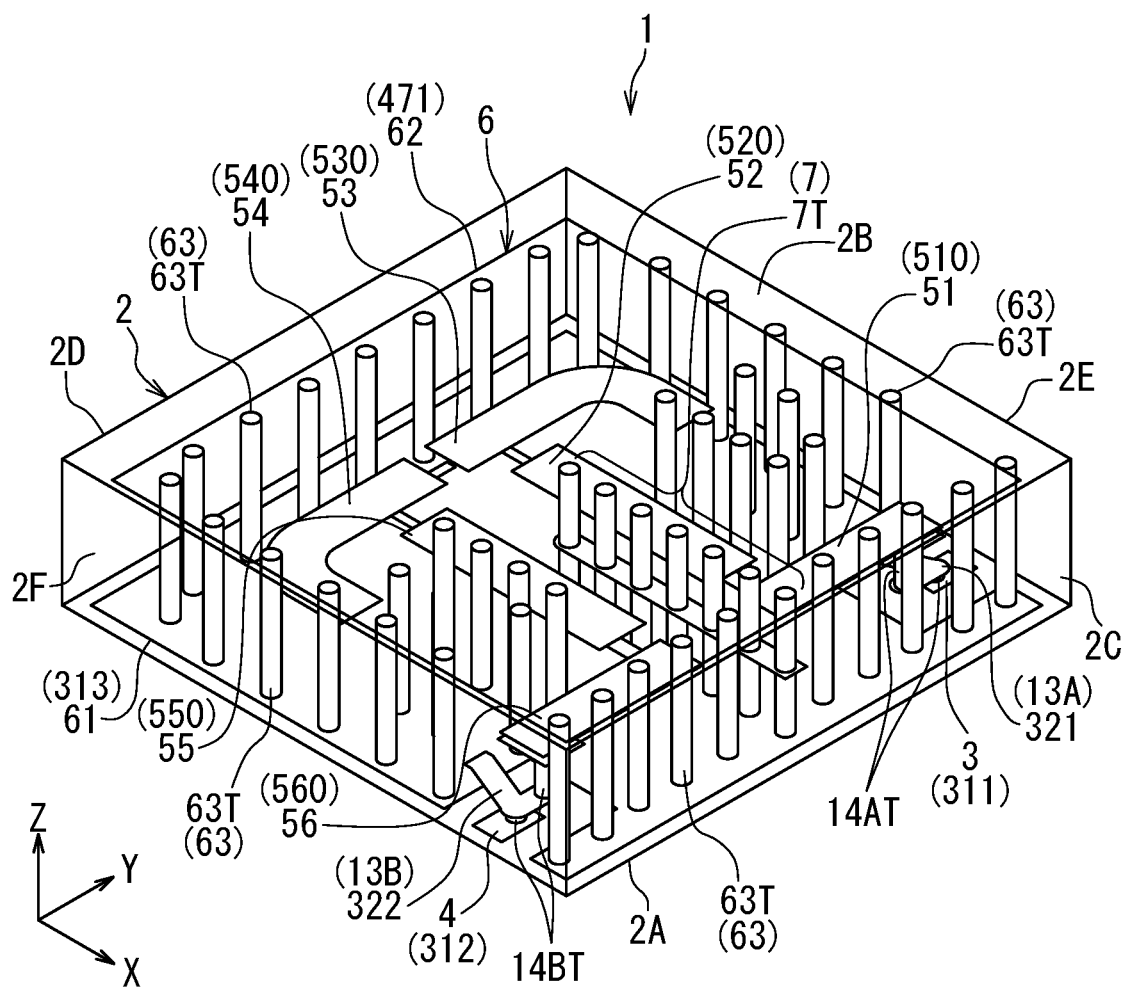
FIG. 1 is perspective view illustrating a structure of a multilayered filter device according to a first embodiment of the invention.
Figure 2:
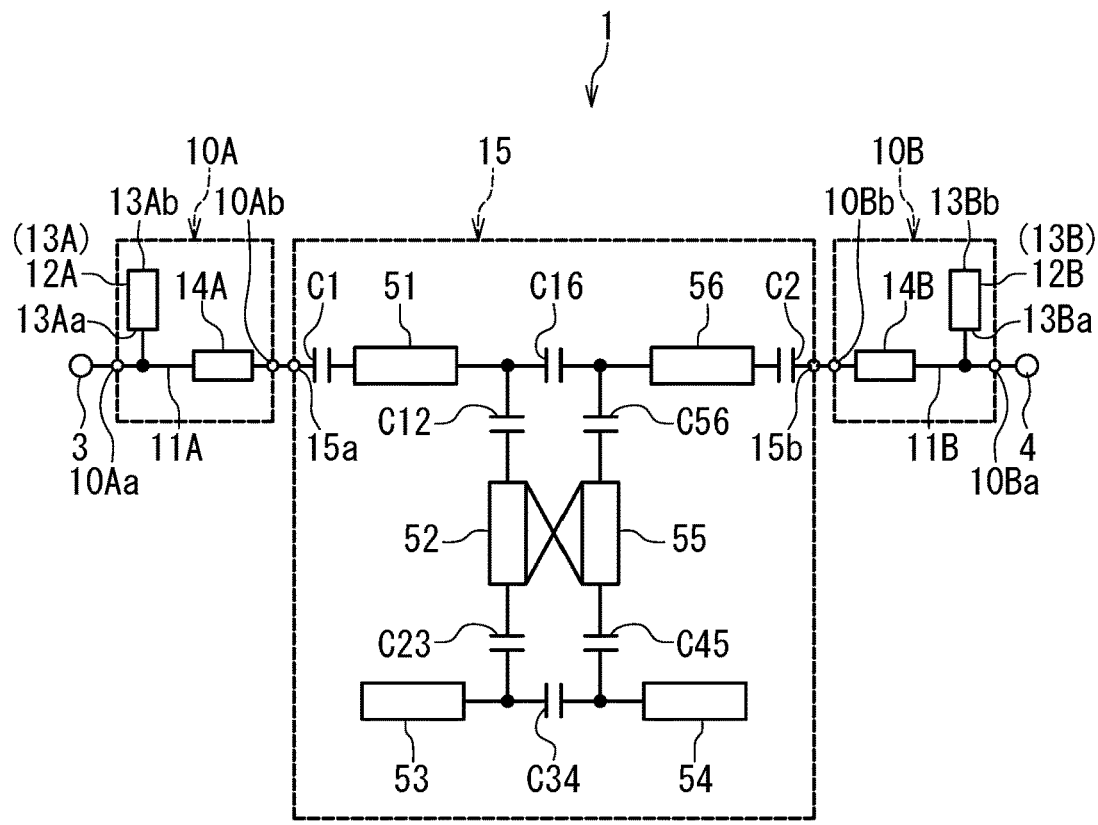
FIG. 2 is a circuit diagram illustrating a circuit configuration of the multilayered filter device according to the first embodiment of the invention.

Preferred embodiments of the present invention will now be described in detail with reference to the drawings. First, reference is made to FIG. 1 and FIG. 2 to describe a configuration of a multilayered filter device according to a first embodiment of the invention. FIG. 1 is a perspective view illustrating a structure of the multilayered filter device according to the present embodiment. FIG. 2 is a circuit diagram illustrating a circuit configuration of the multilayered filter device according to the present embodiment.

As illustrated in FIG. 1, the multilayered filter device 1 according to the present embodiment includes a multilayer stack 2, a first input/output port 3, and a second input/output port 4. The first and second input/output ports 3 and 4 are integrated with the multilayer stack 2. The multilayer stack 2 includes a plurality of dielectric layers and a plurality of conductor layers stacked together.

As illustrated in FIG. 2, the multilayered filter device 1 further includes a first band elimination filter 10A, a second band elimination filter 10B, and a band pass filter 15. The first and second band elimination filters 10A and 10B and the band pass filter 15 are constructed using the multilayer stack 2 and provided between the first input/output port 3 and the second input/output port 4 in circuit configuration. The phrase "in circuit configuration" is herein used to describe layout in a circuit diagram, not in a physical configuration.

The first band elimination filter 10A includes a first input/output 10Aa and a second input/output 10Ab. The first input/output 10Aa is closest to the first input/output port 3 in circuit configuration. The second input/output 10Ab is closest to the second input/output port 4 in circuit configuration. The first input/output 10Aa is connected to the first input/output port 3.

The second band elimination filter 10B includes a first input/output 10Ba and a second input/output 10Bb. The first input/output 10Ba is closest to the second input/output port 4 in circuit configuration. The second input/output 10Bb is closest to the first input/output port 3 in circuit configuration. The first input/output 10Ba is connected to the second input/output port 4.

The band pass filter 15 includes a first input/output 15a and a second input/output 15b. The first input/output 15a is closest to the first input/output port 3 in circuit configuration. The second input/output 15b is closest to the second input/output port 4 in circuit configuration. The first input/output 15a of the band pass filter 15 is connected to the second input/output 10Ab of the first band elimination filter 10A. The second input/output 15b of the band pass filter 15 is connected to the second input/output 10Bb of the second band elimination filter 10B.

The band pass filter 15 further includes at least one first resonator with open ends. In the present embodiment, the band pass filter 15 includes a plurality of first resonators as the at least one first resonator. The plurality of first resonators are configured so that every two of the first resonators adjacent to each other in circuit configuration are electromagnetically coupled to each other.

In the present embodiment, specifically, the plurality of first resonators include a first input/output stage resonator 51 closest to the first input/output port 3 in circuit configuration, a second input/output stage resonator 56 closest to the second input/output port 4 in circuit configuration, and at least one middle resonator located between the first input/output stage resonator 51 and the second input/output stage resonator 56 in circuit configuration. In the present embodiment, the at least one middle resonator is specifically four middle resonators 52, 53, 54, and 55. The band pass filter 15 of the present embodiment thus includes six resonators 51 to 56. All the six resonators 51 to 56 are the first resonators with open ends, and also half-wave resonators.

The six resonators 51, 52, 53, 54, 55, and 56 are arranged in this order, from closest to farthest, from the first input/output port 3 in circuit configuration. The resonators 51 to 56 are configured so that the resonators 51 and 52 are adjacent to each other in circuit configuration and are electromagnetically coupled to each other, the resonators 52 and 53 are adjacent to each other in circuit configuration and are electromagnetically coupled to each other, the resonators 53 and 54 are adjacent to each other in circuit configuration and are electromagnetically coupled to each other, the resonators 54 and 55 are adjacent to each other in circuit configuration and are electromagnetically coupled to each other, and the resonators 55 and 56 are adjacent to each other in circuit configuration and are electromagnetically coupled to each other. In the present embodiment, the electromagnetic coupling between two resonators adjacent to each other in circuit configuration is specifically capacitive coupling.

The band pass filter 15 further includes a capacitor C12 for establishing capacitive coupling between the resonators 51 and 52, a capacitor C23 for establishing capacitive coupling between the resonators 52 and 53, a capacitor C34 for establishing capacitive coupling between the resonators 53 and 54, a capacitor C45 for establishing capacitive coupling between the resonators 54 and 55, and a capacitor C56 for establishing capacitive coupling between the resonators 55 and 56.

In a band pass filter including three or more resonators configured so that every two of the resonators adjacent to each other in circuit configuration are coupled to each other, electromagnetic coupling may be established between two resonators that are not adjacent to each other in circuit configuration. Such electromagnetic coupling between non-adjacent resonators will be referred to as cross coupling. As will be described in detail below, the band pass filter 15 has two cross couplings.

In the present embodiment, among the six resonators 51 to 56, the resonator 52, which is the second closest to the first input/output port 3 in circuit configuration, and the resonator 55, which is the second closest to the second input/output port 4 in circuit configuration, are magnetically coupled to each other although they are not adjacent to each other in circuit configuration.

Further, in the present embodiment, among the six resonators 51 to 56, the resonator 51, which is the closest to the first input/output port 3 in circuit configuration, and the resonator 56, which is the closest to the second input/output port 4 in circuit configuration, are capacitively coupled to each other although they are not adjacent to each other in circuit configuration. In FIG. 2, the capacitor symbol C16 represents the capacitive coupling between the resonators 51 and 56.

The band pass filter 15 further includes a capacitor C1 provided between the first input/output 15a and the resonator 51, and a capacitor C2 provided between the second input/output 15b and the resonator 56.

The first band elimination filter 10A further includes a connection path 11A connecting the first input/output 10Aa and the second input/output 10Ab, and a resonator 12A coupled to the connection path 11A. The resonator 12A corresponds to the second resonator in the present invention. The connection path 11A includes an impedance transformer 14A. The impedance transformer 14A includes a through hole line portion 14AT illustrated in FIG. 1. The through hole line portion 14AT includes at least one through hole provided in the multilayer stack 2.

The resonator 12A includes a conductor line 13A constituting a distributed constant line. The conductor line 13A has a first end 13Aa directly connected to the connection path 11A, and a second end 13Ab farthest from the connection path 11A in circuit configuration. The second end 13Ab is open.

The second band elimination filter 10B further includes a connection path 11B connecting the first input/output 10Ba and the second input/output 10Bb, and a resonator 12B coupled to the connection path 11B. The resonator 12B corresponds to the second resonator in the present invention. The connection path 11B includes an impedance transformer 14B. The impedance transformer 14B includes a through hole line portion 14BT illustrated in FIG. 1. The through hole line portion 14BT includes at least one through hole provided in the multilayer stack 2.

The resonator 12B includes a conductor line 13B constituting a distributed constant line. The conductor line 13B has a first end 13B a directly connected to the connection path 11B, and a second end 13Bb farthest from the connection path 11B in circuit configuration. The second end 13Bb is open.

As illustrated in FIG. 1, the multilayered filter device 1 further includes a shield 6 and a coupling adjustment section 7. The shield 6 is formed of a conductor and integrated with the multilayer stack 2. The shield 6 is connected to ground. The shield 6 has the function of preventing electromagnetic radiation to the surroundings of the multilayered filter device 1. The coupling adjustment section 7 is formed of a conductor, provided within the multilayer stack 2 and electrically connected to the shield 6.

Here, X, Y, and Z directions are defined as illustrated in FIG. 1. The X, Y, and Z directions are orthogonal to one another. In the present embodiment, the direction in which the plurality of dielectric layers are stacked is the Z direction (the upward direction in FIG. 1).

The multilayer stack 2 has a rectangular parallelepiped shape. The multilayer stack 2 has a first end face 2A and a second end face 2B located at opposite ends in the Z direction of the multilayer stack 2, and further has four side surfaces 2C, 2D, 2E, and 2F connecting the first end face 2A and the second end face 2B. The first end face 2A is also the bottom surface of the multilayer stack 2. The second end face 2B is also the top surface of the multilayer stack 2. The side surfaces 2C and 2D are located at opposite ends in the X direction of the multilayer stack 2. The side surfaces 2E and 2F are located at opposite ends in the Y direction of the multilayer stack 2.

The shield 6 includes a first portion 61 and a second portion 62 spaced from each other in the Z direction, and a connecting portion 63 connecting the first portion 61 and the second portion 62. The first portion 61, the second portion 62, and the connecting portion 63 are arranged to surround the six resonators 51 to 56. The first portion 61 is formed of a conductor layer 313. The second portion 62 is formed of a conductor layer 471.

The resonators 51, 52, 53, 54, 55, and 56 respectively include resonator conductor portions 510, 520, 530, 540, 550, and 560 each of which is formed of a line of conductor. Each of the resonator conductor portions 510, 520, 530, 540, 550, and 560 extends in a direction orthogonal to the Z direction.

Each of the resonator conductor portions 510, 520, 530, 540, 550, and 560 has a first end and a second end which are opposite ends of the line and are open. Each of the resonator conductor portions 510, 520, 530, 540, 550, and 560 has a length of one half or nearly one half the wavelength corresponding to the center frequency of the passband of the band pass filter 15.

The coupling adjustment section 7 is intended to adjust the magnitude of the capacitive coupling between the resonators 51 and 56 and the magnitude of the magnetic coupling between the resonators 52 and 55. The coupling adjustment section 7 extends in the Z direction and comes in contact with the first portion 61 and the second portion 62. A portion of the coupling adjustment section 7 extends to pass between the resonator conductor portion 510 and the resonator conductor portion 560. Another portion of the coupling adjustment section 7 extends to pass between the resonator conductor portion 520 and the resonator conductor portion 550.

The coupling adjustment section 7 includes a plurality of series of through holes 7T. In FIG. 1, each series of through holes 7T is represented by a circular column. Each series of through holes 7T includes two or more through holes connected in series. Each series of through holes 7T extends in the Z direction. The plurality of series of through holes 7T are arranged to be adjacent to each other in the X direction. The number of the plurality of series of through holes 7T is seven in the present embodiment.

The connecting portion 63 of the shield 6 includes a plurality of series of through hole 63T. In FIG. 1, each series of through holes 63T is represented by a circular column. All the series of through holes represented by circular columns in FIG. 1 except the seven series of through holes 7T are the series of through holes 63T. Each series of through holes 63T includes two or more through holes connected in series. Each series of the through holes 63T extends in the Z direction.

Reference is now made to FIG. 3 to FIG. 9 to describe an example of the dielectric layers constituting the multilayer stack 2 and the configuration of a plurality of conductor layers formed on the dielectric layers and a plurality of through holes formed in the dielectric layers. In this example, the multilayer stack 2 includes seventeen dielectric layers stacked together. The seventeen dielectric layers will be referred to as a first to a seventeenth dielectric layer in the order from bottom to top. The first to seventeenth dielectric layers are denoted by reference numerals 31 to 47, respectively. In FIG. 3 to FIG. 8, each circle represents a through hole.

Figure 3:
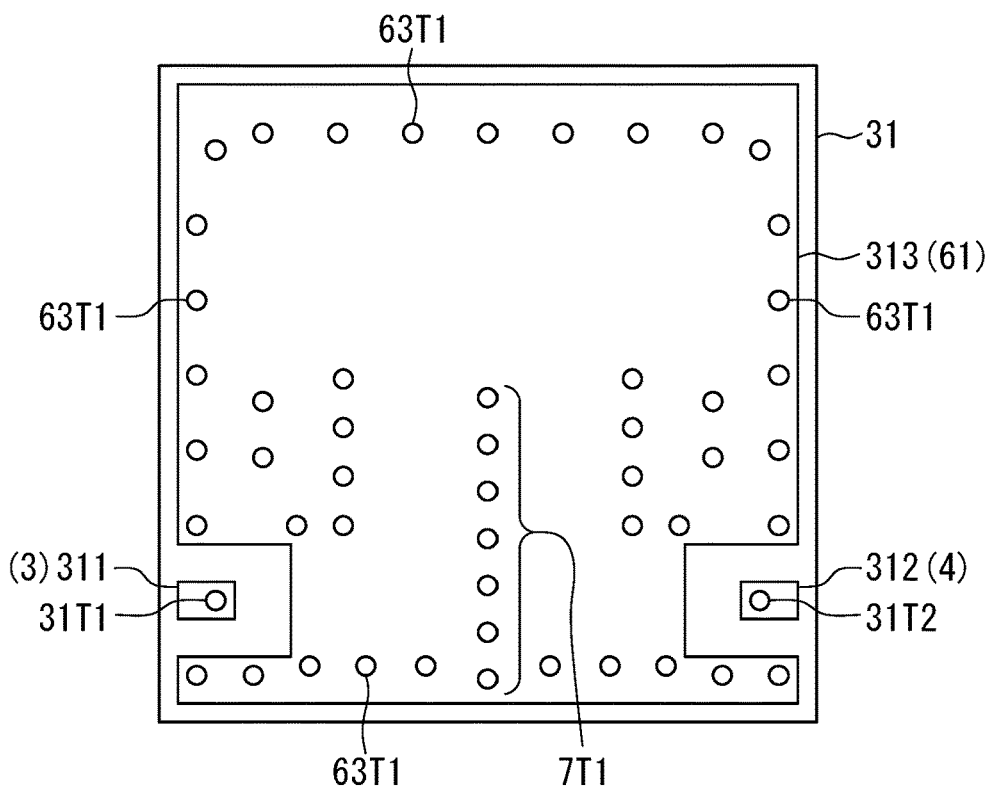
FIG. 3 is an explanatory diagram illustrating a patterned surface of a first dielectric layer of a multilayer stack illustrated in FIG. 1.

FIG. 3 illustrates a patterned surface of the first dielectric layer 31. On the patterned surface of the first dielectric layer 31, there are formed a conductor layer 311 forming the first input/output port 3, a conductor layer 312 forming the second input/output port 4, and the conductor layer 313 forming the first portion 61 of the shield 6.

Further, a through hole 31T1 connected to the conductor layer 311, and a through hole 31T2 connected to the conductor layer 312 are formed in the dielectric layer 31. Further formed in the dielectric layer 31 are seven through holes 7T1 constituting respective portions of the seven series of through holes 7T, and a plurality of through holes 63T1 constituting respective portions of the plurality of series of through holes 63T. All the through holes represented by circles in FIG. 3 except the through holes 31T1, 31T2 and 7T1 are the through holes 63T1. The through holes 7T1 and 63T1 are connected to the conductor layer 313.

Figure 4:
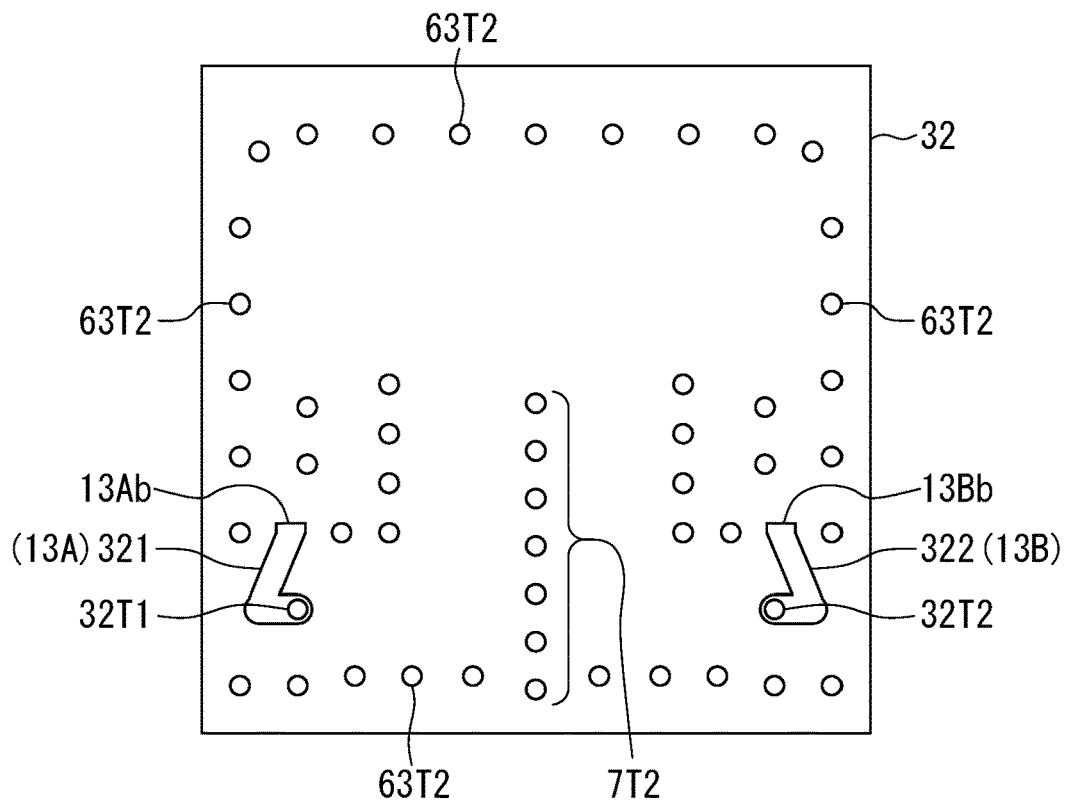
FIG. 4 is an explanatory diagram illustrating a patterned surface of a second dielectric layer of the multilayer stack illustrated in FIG. 1.

FIG. 4 illustrates a patterned surface of the second dielectric layer 32. A conductor layer 321 forming the conductor line 13A and a conductor layer 322 forming the conductor line 13B are formed on the patterned surface of the dielectric layer 32. Each of the conductor layers 321 and 322 has a first end and a second end opposite to each other. The through hole 31T1 formed in the first dielectric layer 31 is connected to a portion of the conductor layer 321 near the first end thereof. The through hole 31T2 formed in the first dielectric layer 31 is connected to a portion of the conductor layer 322 near the first end thereof. A portion of the conductor layer 321 near the second end thereof and a portion of the conductor layer 322 near the second end thereof are opposed to the conductor layer 313 illustrated in FIG. 3 with the dielectric layer 31 interposed between the conductor layer 313 and each of the conductor layers 321 and 322.

In the dielectric layer 32, there are formed a through hole 32T1 connected to the portion of the conductor layer 321 near the first end thereof, and a through hole 32T2 connected to the portion of the conductor layer 322 near the first end thereof. Further formed in the dielectric layer 32 are seven through holes 7T2 constituting respective portions of the seven series of through holes 7T. The seven through holes 7T1 illustrated in FIG. 3 are respectively connected to the seven through holes 7T2.

Further formed in the dielectric layer 32 are a plurality of through holes 63T2 constituting respective portions of the plurality of series of through holes 63T. All the through holes represented by circles in FIG. 4 except the through holes 32T1, 32T2 and 7T2 are the through holes 63T2. The plurality of through holes 63T1 illustrated in FIG. 3 are respectively connected to the plurality of through holes 63T2.

Figure 5:
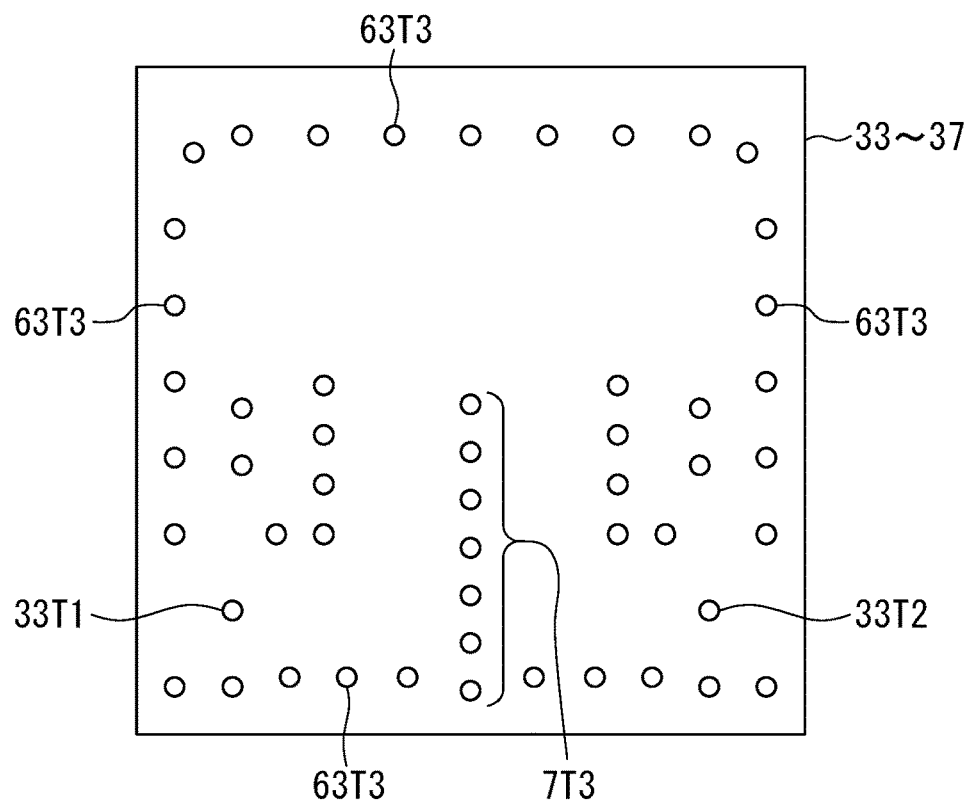
FIG. 5 is an explanatory diagram illustrating a patterned surface of each of a third to a seventh dielectric layer of the multilayer stack illustrated in FIG. 1.

FIG. 5 illustrates a patterned surface of each of the third to seventh dielectric layers 33 to 37. Through holes 33T1 and 33T2 are formed in each of the dielectric layers 33 to 37. The through holes 32T1 and 32T2 illustrated in FIG. 4 are respectively connected to the through holes 33T1 and 33T2 formed in the third dielectric layer 33.

In each of the dielectric layers 33 to 37, further formed are seven through holes 7T3 constituting respective portions of the seven series of through holes 7T. The seven through holes 7T2 illustrated in FIG. 4 are respectively connected to the seven through holes 7T3 formed in the third dielectric layer 33.

Further, a plurality of through holes 63T3 constituting respective portions of the plurality of series of through holes 63T are formed in each of the dielectric layers 33 to 37. All the through holes represented by circles in FIG. 5 except the through holes 33T1, 33T2 and 7T3 are the through holes 63T3. The plurality of through holes 63T2 illustrated in FIG. 4 are respectively connected to the plurality of through holes 63T3 formed in the third dielectric layer 33.

In the dielectric layers 33 to 37, every vertically adjacent through holes denoted by the same reference signs are connected to each other.

Figure 6:
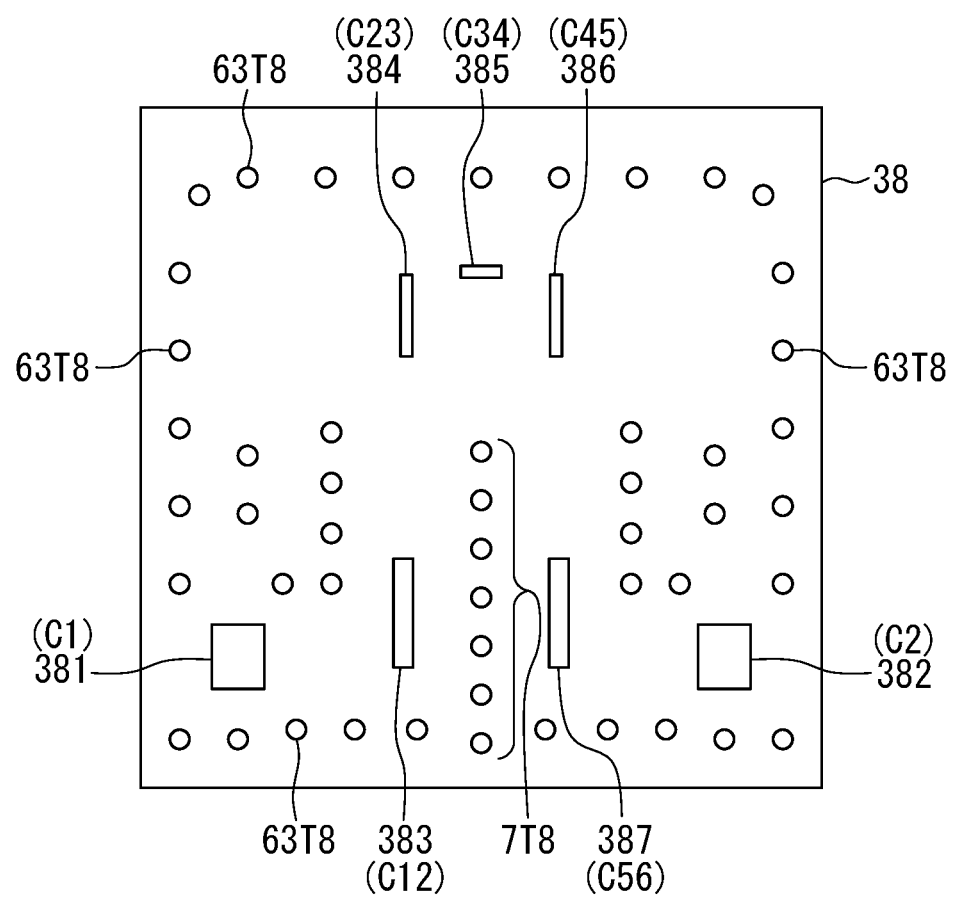
FIG. 6 is an explanatory diagram illustrating a patterned surface of an eighth dielectric layer of the multilayer stack illustrated in FIG. 1.

FIG. 6 illustrates a patterned surface of the eighth dielectric layer 38. On the patterned surface of the dielectric layer 38, there are formed a conductor layer 381 for forming the capacitor C1 illustrated in FIG. 2 and a conductor layer 382 for forming the capacitor C2 illustrated in FIG. 2. The through hole 33T1 formed in the seventh dielectric layer 37 is connected to the conductor layer 381. The through hole 33T2 formed in the seventh dielectric layer 37 is connected to the conductor layer 382.

On the patterned surface of the dielectric layer 38, there are further formed conductor layers 383, 384, 385, 386, and 387 for forming the capacitors C12, C23, C34, C45, and C56 illustrated in FIG. 2, respectively.

Further, seven through holes 7T8 constituting respective portions of the seven series of through holes 7T are formed in the dielectric layer 38. The seven through holes 7T3 formed in the seventh dielectric layer 37 are respectively connected to the seven through holes 7T8.

Further formed in the dielectric layer 38 are a plurality of through holes 63T8 constituting respective portions of the plurality of series of through holes 63T. All the through holes represented by circles in FIG. 6 except the seven through holes 7T8 are the through holes 63T8. The plurality of through holes 63T3 formed in the seventh dielectric layer 37 are respectively connected to the plurality of through holes 63T8.

Figure 7:
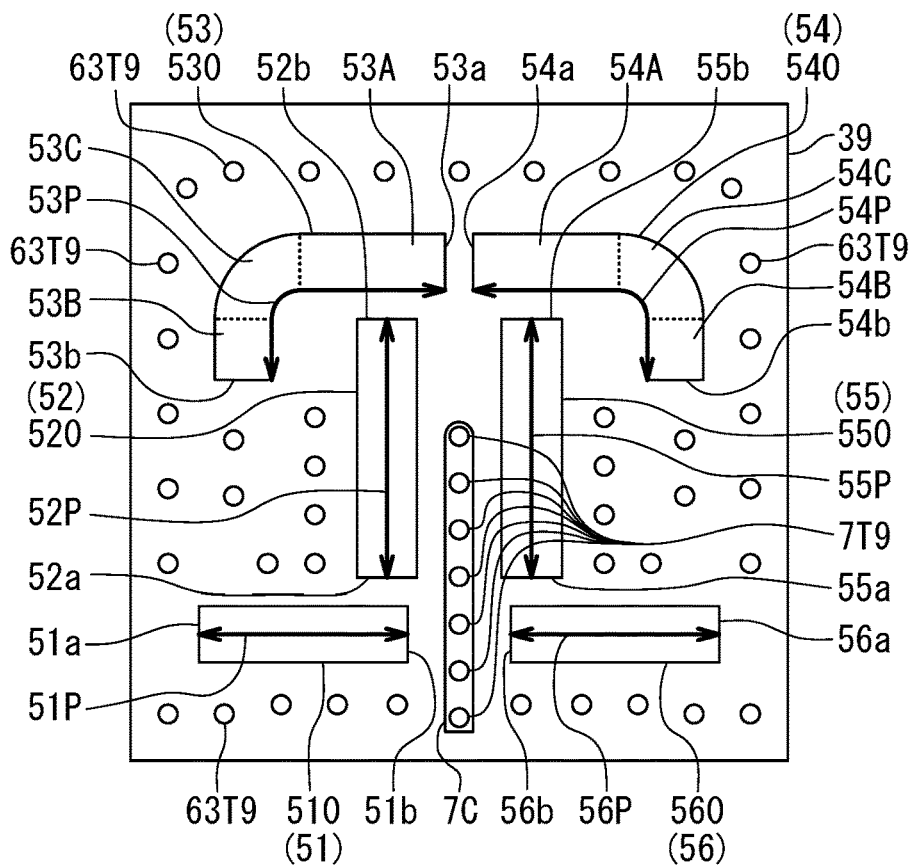
FIG. 7 is an explanatory diagram illustrating a patterned surface of a ninth dielectric layer of the multilayer stack illustrated in FIG. 1.

FIG. 7 illustrates a patterned surface of the ninth dielectric layer 39. The resonator conductor portions 510, 520, 530, 540, 550, and 560 are formed on the patterned surface of the dielectric layer 39. The resonator conductor portion 510 has a first end 51$a$ and a second end 51$b$ which are opposite ends of the line. The resonator conductor portion 520 has a first end 52$a$ and a second end 52$b$ which are opposite ends of the line. The resonator conductor portion 530 has a first end 53$a$ and a second end 53$b$ which are opposite ends of the line. The resonator conductor portion 540 has a first end 54$a$ and a second end 54$b$ which are opposite ends of the line. The resonator conductor portion 550 has a first end 55$a$ and a second end 55$b$ which are opposite ends of the line. The resonator conductor portion 560 has a first end 56$a$ and a second end 56$b$ which are opposite ends of the line.

The thick arrows in FIG. 7 represent shortest paths 51P, 52P, 53P, 54P, 55P, and 56P connecting the respective first and second ends of the resonator conductor portions 510, 520, 530, 540, 550, and 560. Each shortest path corresponds to the shortest current path in the resonator conductor portion.

The resonator conductor portions 510 and 560 each extend in the Y direction. The resonator conductor portions 510 and 560 are arranged in such a positional relationship that a single straight line extending in the Y direction intersects the resonator conductor portions 510 and 560. The second end 51$b$ of the resonator conductor portion 510 and the second end 56$b$ of the resonator conductor portion 560 are adjacent to each other with a predetermined distance therebetween. The distance between the second end 51$b$ and the second end 56$b$ is sufficiently smaller than the length of each of the resonator conductor portions 510 and 560.

The resonator conductor portions 520 and 550 each extend in the X direction. The resonator conductor portions 520 and 550 are adjacent to each other in the Y direction with a predetermined distance therebetween. The distance between the resonator conductor portions 520 and 550 is sufficiently smaller than the length of each of the resonator conductor portions 520 and 550.

The first end 52$a$ of the resonator conductor portion 520 is located near the second end 51$b$ of the resonator conductor portion 510. The first end 55$a$ of the resonator conductor portion 550 is located near the second end 56$b$ of the resonator conductor portion 560.

The resonator conductor portion 530 includes a first portion 53A, a second portion 53B, and a third portion 53C. The first portion 53A includes the first end 53$a$, and the second portion 53B includes the second end 53$b$. The first portion 53A extends in the Y direction, and the second portion 53B extends in the X direction. The third portion 53C connects an end of the first portion 53A opposite from the first end 53$a$ and an end of the second portion 53B opposite from the second end 53$b$. In FIG. 7, the boundary between the first portion 53A and the third portion 53C and the boundary between the second portion 53B and the third portion 53C are shown in broken lines. The first end 53$a$ is located near the second end 52$b$ of the resonator conductor portion 520.

The resonator conductor portion 540 includes a first portion 54A, a second portion 54B, and a third portion 54C. The first portion 54A includes the first end 54$a$, and the second portion 54B includes the second end 54$b$. The first portion 54A extends in the Y direction, and the second portion 54B extends in the X direction. The third portion 54C connects an end of the first portion 54A opposite from the first end 54$a$ and an end of the second portion 54B opposite from the second end 54$b$. In FIG. 7, the boundary between the first portion 54A and the third portion 54C and the boundary between the second portion 54B and the third portion 54C are shown in broken lines. The first end 54$a$ is located near the second end 55$b$ of the resonator conductor portion 550.

The first end 53$a$ of the resonator conductor portion 530 and the first end 54$a$ of the resonator conductor portion 540 are adjacent to each other with a predetermined distance therebetween.

Further, a conductor layer 7C forming a portion of the coupling adjustment section 7 is formed on the patterned surface of the dielectric layer 39. The conductor layer 7C extends in the X direction. A portion of the conductor layer 7C is located between the resonator conductor portion 510 and the resonator conductor portion 560. Another portion of the conductor layer 7C is located between the resonator conductor portion 520 and the resonator conductor portion 550.

Further, seven through holes 7T9 constituting respective portions of the seven series of through holes 7T are formed in the dielectric layer 39. The seven through holes 7T9 are connected to the conductor layer 7C. The seven through holes 7T8 illustrated in FIG. 6 are respectively connected to the seven through holes 7T9.

Further formed in the dielectric layer 39 are a plurality of through holes 63T9 constituting respective portions of the plurality of series of through holes 63T. All the through holes represented by circles in FIG. 7 except the seven through holes 7T9 are the through holes 63T9. The plurality of through holes 63T8 illustrated in FIG. 6 are respectively connected to the plurality of through holes 63T9.

Figure 8:
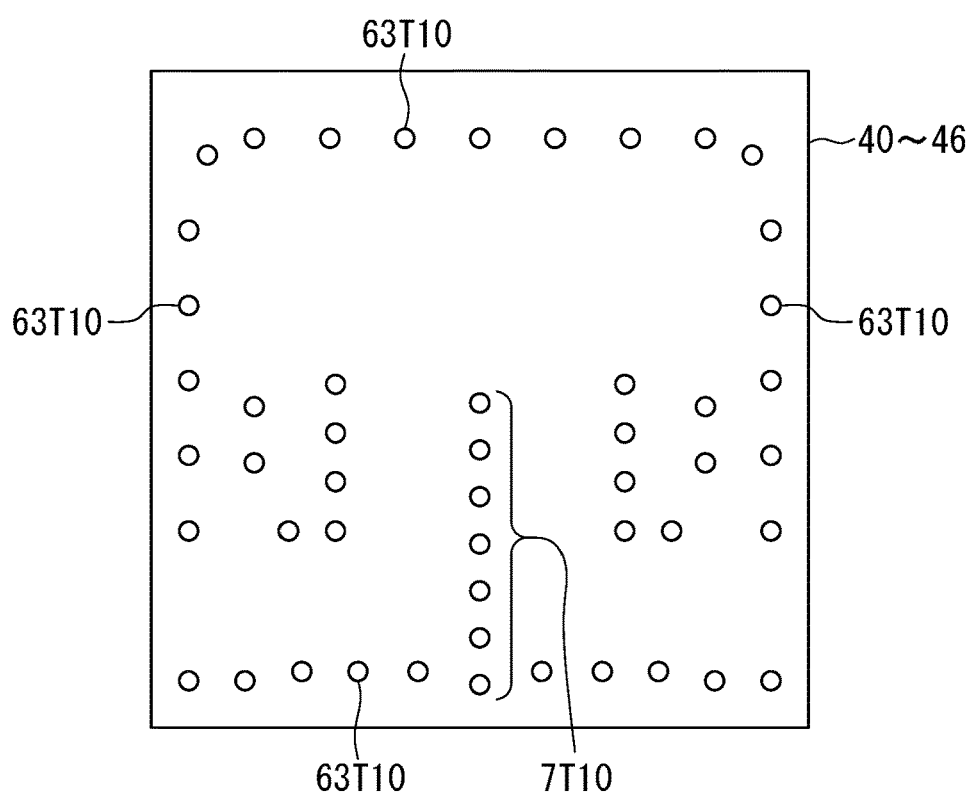
FIG. 8 is an explanatory diagram illustrating a patterned surface of each of a tenth to a sixteenth dielectric layer of the multilayer stack illustrated in FIG. 1.

FIG. 8 illustrates a patterned surface of each of the tenth to sixteenth dielectric layers 40 to 46. Seven through holes 7T10 constituting respective portions of the seven series of through holes 7T are formed in each of the dielectric layers 40 to 46. The seven through holes 7T9 illustrated in FIG. 7 are respectively connected to the seven through holes 7T10 formed in the tenth dielectric layer 40.

Further, a plurality of through holes 63T10 constituting respective portions of the plurality of series of through holes 63T are formed in each of the dielectric layers 40 to 46. All the through holes represented by circles in FIG. 8 except the seven through holes 7T10 are the through holes 63T10. The plurality of through holes 63T9 illustrated in FIG. 7 are respectively connected to the plurality of through holes 63T10 formed in the tenth dielectric layer 40.

In the dielectric layers 40 to 46, every vertically adjacent through holes denoted by the same reference signs are connected to each other.

Figure 9:
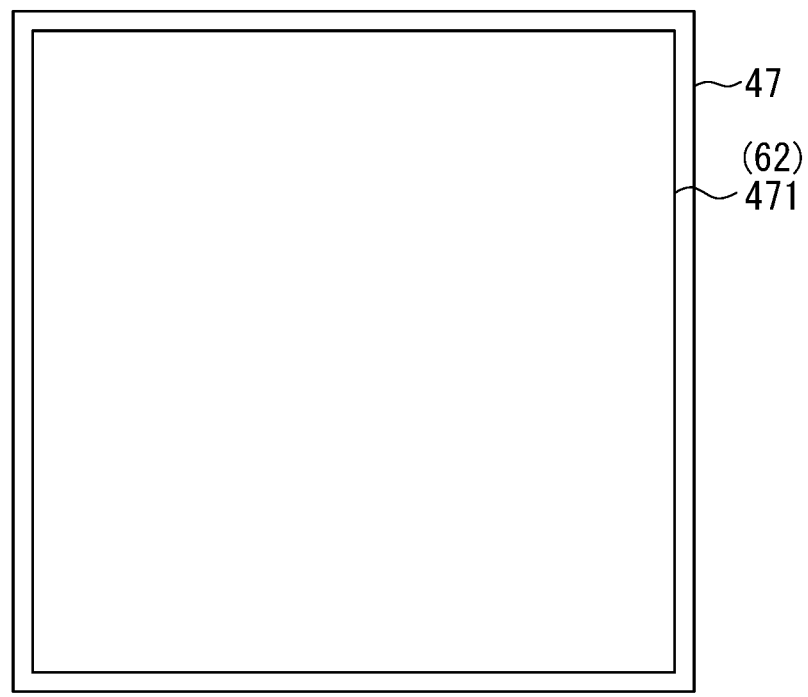
FIG. 9 is an explanatory diagram illustrating a patterned surface of a seventeenth dielectric layer of the multilayer stack illustrated in FIG. 1.

FIG. 9 illustrates a patterned surface of the seventeenth dielectric layer 47. The conductor layer 471 forming the second portion 62 of the shield 6 is formed on the patterned surface of the dielectric layer 47. The through holes 7T10 and 63T10 formed in the sixteenth dielectric layer 46 are connected to the conductor layer 471.

The multilayered filter device 1 according to the present embodiment is constructed by stacking the first to seventeenth dielectric layers 31 to 47 with the patterned surface of the first dielectric layer 31 facing downward and a surface of the seventeenth dielectric layer 47 opposite to its patterned surface facing upward.

The respective resonator conductor portions 510, 520, 530, 540, 550, and 560 of the resonators 51 to 56 are located at the same position in the Z direction within the multilayer stack 2.

Correspondences of the circuit components of the multilayered filter device 1 illustrated in FIG. 2 with the components of the multilayer stack 2 illustrated in FIG. 3 to FIG. 9 will now be described.

To begin with, a description will be given of the band pass filter 15. The conductor layer 311 forming the first input/output port 3 is connected to the conductor layer 381 illustrated in FIG. 6 via the through holes 31T1, 32T1 and 33T1 and the conductor layer 321. The conductor layer 381 is opposed to a portion of the resonator conductor portion 510 near the first end 51a illustrated in FIG. 7, with the dielectric layer 38 interposed between the conductor layer 381 and the resonator conductor portion 510. The capacitor C1 illustrated in FIG. 2 is composed of the conductor layer 381, the resonator conductor portion 510, and the dielectric layer 38 interposed between the conductor layer 381 and the resonator conductor portion 510.

The conductor layer 312 forming the second input/output port 4 is connected to the conductor layer 382 illustrated in FIG. 6 via the through holes 31T2, 32T2 and 33T2 and the conductor layer 322. The conductor layer 382 is opposed to a portion of the resonator conductor portion 560 near the first end 56a illustrated in FIG. 7, with the dielectric layer 38 interposed between the conductor layer 382 and the resonator conductor portion 560. The capacitor C2 illustrated in FIG. 2 is composed of the conductor layer 382, the resonator conductor portion 560, and the dielectric layer 38 interposed between the conductor layer 382 and the resonator conductor portion 560.

The conductor layer 383 illustrated in FIG. 6 is opposed to a portion of the resonator conductor portion 510 near the second end 51b and to a portion of the resonator conductor portion 520 near the first end 52a, with the dielectric layer 38 interposed between the conductor layer 383 and each of the resonator conductor portions 510 and 520. The capacitor C12 illustrated in FIG. 2 is composed of the conductor layer 383, the resonator conductor portions 510 and 520, and the dielectric layer 38 interposed between the conductor layer 383 and the resonator conductor portions 510 and 520.

The conductor layer 384 illustrated in FIG. 6 is opposed to a portion of the resonator conductor portion 520 near the second end 52b and to a portion of the resonator conductor portion 530 near the first end 53a, with the dielectric layer 38 interposed between the conductor layer 384 and each of the resonator conductor portions 520 and 530. The capacitor C23 illustrated in FIG. 2 is composed of the conductor layer 384, the resonator conductor portions 520 and 530, and the dielectric layer 38 interposed between the conductor layer 384 and the resonator conductor portions 520 and 530.

The conductor layer 385 illustrated in FIG. 6 is opposed to the portion of the resonator conductor portion 530 near the first end 53a and to a portion of the resonator conductor portion 540 near the first end 54a, with the dielectric layer 38 interposed between the conductor layer 385 and each of the resonator conductor portions 530 and 540. The capacitor C34 illustrated in FIG. 2 is composed of the conductor layer 385, the resonator conductor portions 530 and 540, and the dielectric layer 38 interposed between the conductor layer 385 and the resonator conductor portions 530 and 540.

The conductor layer 386 illustrated in FIG. 6 is opposed to the portion of the resonator conductor portion 540 near the first end 54a and to a portion of the resonator conductor portion 550 near the second end 55b, with the dielectric layer 38 interposed between the conductor layer 386 and each of the resonator conductor portions 540 and 550. The capacitor C45 illustrated in FIG. 2 is composed of the conductor layer 386, the resonator conductor portions 540 and 550, and the dielectric layer 38 interposed between the conductor layer 386 and the resonator conductor portions 540 and 550.

The conductor layer 387 illustrated in FIG. 6 is opposed to a portion of the resonator conductor portion 550 near the first end 55a and to a portion of the resonator conductor portion 560 near the second end 56b, with the dielectric layer 38 interposed between the conductor layer 387 and each of the resonator conductor portions 550 and 560. The capacitor C56 illustrated in FIG. 2 is composed of the conductor layer 387, the resonator conductor portions 550 and 560, and the dielectric layer 38 interposed between the conductor layer 387 and the resonator conductor portions 550 and 560.

Next, the first band elimination filter 10A will be described. The connection path 11A and the impedance transformer 14A illustrated in FIG. 2 are formed of the through holes 31T1, 32T1 and 33T1 and the conductor layer 321. The impedance transformer 14A includes the through hole line portion 14AT. The through hole line portion 14AT includes the through holes 31T1, 32T1 and 33T1.

The conductor line 13A constituting the resonator 12A is formed of the conductor layer 321 illustrated in FIG. 4. The position where the conductor layer 321 and the through hole 31T1 are connected corresponds to the first end 13Aa of the conductor line 13A. As illustrated in FIG. 4, the second end 13Ab of the conductor line 13A is an end of the conductor layer 321 farthest from the position where the conductor layer 321 and the through hole 13T1 are connected.

The resonator 12A is a quarter-wave resonator. The resonance frequency of the resonator 12A is the same or nearly the same as the center frequency of the stopband of the first band elimination filter 10A. The distance from the first end 13Aa to the second end 13Ab of the conductor line 13A has a value equal to or nearly equal to a quarter of the wavelength corresponding to the center frequency of the stopband of the first band elimination filter 10A.

Next, the second band elimination filter 10B will be described. The connection path 11B and the impedance transformer 14B illustrated in FIG. 2 are formed of the through holes 31T2, 32T2 and 33T2 and the conductor layer 322. The impedance transformer 14B includes the through hole line portion 14BT. The through hole line portion 14BT includes the through holes 31T2, 32T2 and 33T2.

The conductor line 13B constituting the resonator 12B is formed of the conductor layer 322 illustrated in FIG. 4. The position where the conductor layer 322 and the through hole 31T2 are connected corresponds to the first end 13Ba of the conductor line 13B. As illustrated in FIG. 4, the second end 13Bb of the conductor line 13B is an end of the conductor layer 322 farthest from the position where the conductor layer 322 and the through hole 13T2 are connected.

The resonator 12B is a quarter-wave resonator. The resonance frequency of the resonator 12B is the same or nearly the same as the center frequency of the stopband of the second band elimination filter 10B. The distance from the first end 13Ba to the second end 13Bb of the conductor line 13B has a value equal to or nearly equal to a quarter of the wavelength corresponding to the center frequency of the stopband of the second band elimination filter 10B.

Next, the coupling adjustment section 7 and the shield 6 will be described. The coupling adjustment section 7 is formed of the seven series of through holes 7T and the conductor layer 7C illustrated in FIG. 7. The seven series of through holes 7T are each constituted of the through holes 7T1, 7T2, 7T3, 7T8, 7T9 and 7T10 connected in series in the Z direction.

The shield 6 includes the first portion 61, the second portion 62, and the connecting portion 63. The first portion 61 is formed of the conductor layer 313. The second portion 62 is formed of the conductor layer 471. The connecting portion 63 includes the plurality of series of through holes 63T. The plurality of series of through holes 63T are each constituted of the through holes 63T1, 63T2, 63T3, 63T8, 63T9 and 63T10 connected in series in the Z direction.

The features of the multilayered filter device 1 according to the present embodiment will now be described. The band pass filter 15 is designed and configured to have a passband in a quasi-millimeter wave band of 10 to 30 GHz or a millimeter wave band of 30 to 300 GHz, for example.

The band pass filter 15 includes six resonators 51 to 56. All the six resonators 51 to 56 are the first resonators with open ends. The resonator conductor portions 510, 520, 530, 540, 550, and 560 forming the resonators 51 to 56 each include a first end and a second end which are opposite ends of the line and are open. No through hole is connected to each of the resonator conductor portions 510, 520, 530, 540, 550, and 560.

In the present embodiment, the resonators 51 to 56 are the first resonators with open ends. Each of the resonator conductor portions 510, 520, 530, 540, 550 and 560 can thus be formed of a conductor layer simple in structure with no through hole connected thereto. This makes it possible to precisely fabricate the resonators 51 to 56 using the multilayer stack 2, and consequently, makes it possible to reduce or eliminate variations in the characteristics of the band pass filter 15.

Each of the resonator conductor portions 510, 520, 530, 540, 550 and 560 may have one or more harmonic resonance modes, which are resonance modes of harmonics of one or more orders, as well as a basic resonance mode having a basic resonance frequency which determines the passband of the band pass filter 15. The resonance frequency of a harmonic resonance mode that is the lowest in resonance frequency (hereinafter referred to as a lowest-order harmonic resonance mode) among the one or more harmonic resonance modes is twice as high as the basic resonance frequency. The lowest-order harmonic resonance mode of each of the resonator conductor portions 510, 520, 530, 540, 550 and 560 may degrade the attenuation characteristic of the band pass filer 15 in a frequency region higher than the passband of the band pass filter 15 and including a frequency twice as high as the center frequency of the passband.

The multilayered filter device 1 according to the present embodiment includes the first and second band elimination filters 10A and 10B as well as the band pass filter 15. The first and second band elimination filters 10A and 10B cause an insertion loss at a frequency twice as high as the center frequency of the passband of the band pass filter 15 to be higher than in the case without the first and second band elimination filters 10A and 10B in the frequency response of insertion loss between the first input/output port 3 and the second input/output port 4. The center frequency of the stopband of each of the first and second band elimination filters 10A and 10B is twice or almost twice as high as the center frequency of the passband of the band pass filter 15. This makes it possible to prevent degradation in the attenuation characteristic in a frequency region higher than the passband of the band pass filter 15 as the characteristics of the multilayered filter device 1 are viewed as a whole.

Thus, according to the present embodiment, there is provided the multilayered filter device 1 that includes the band pass filter 15 and makes it possible to reduce or eliminate variations in the characteristics of the band pass filter 15 and to prevent degradation in the attenuation characteristic in a frequency region higher than the passband of the band pass filter 15.

The first band elimination filter 10A includes the resonator 12A and the impedance transformer 14A. The resonator 12A includes the conductor line 13A constituting a distributed constant line. The impedance transformer 14A includes the through hole line portion 14AT. Similarly, the second band elimination filter 10B includes the resonator 12B and the impedance transformer 14B. The resonator 12B includes the conductor line 13B constituting a distributed constant line. The impedance transformer 14B includes the through hole line portion 14BT. It is possible to precisely construct the first and second band elimination filters 10A and 10B of such a configuration by using the multilayer stack 2. The present embodiment thus makes it possible to reduce or eliminate variations in the characteristics of the first and second band elimination filters 10A and 10B.

Furthermore, according to the present embodiment, since the impedance transformers 14A and 14B respectively include the through hole line portions 14AT and 14BT, the projection image of the impedance transformers 14A and 14B vertically projected onto the first end face 2A of the multilayer stack 2 has a smaller area than in a case where the impedance transformers 14A and 14B are each formed only of a conductor line. This makes it possible to reduce the footprint of the multilayered filter device 1 on a substrate to which the multilayered filter device 1 is to be mounted.

In the present embodiment, an optimum length of the shortest path of the resonator conductor portion of each input/output stage resonator varies depending on the impedance of the second resonator of the band elimination filter connected to the input/output resonator. More specifically, an optimum length of the shortest path 51P of the resonator conductor portion 510 of the first input/output stage resonator 51 varies depending on the impedance of the resonator 12A of the first band elimination filter 10A. Further, the optimum length of the shortest path 51P is shorter than in the case without the first band elimination filter 10A. Similarly, an optimum length of the shortest path 56P of the resonator conductor portion 560 of the second input/output stage resonator 56 varies depending on the impedance of the resonator 12B of the second band elimination filter 10B. Furthermore, the optimum length of the shortest path 56P is shorter than in the case without the second band elimination filter 10B.

In the present embodiment, due to the features described above, as illustrated in FIG. 7, the shortest paths 51P and 56P of the resonator conductor portions 510 and 560 are shorter than the shortest paths 52P, 53P, 54P, and 55P of the resonator conductor portions 520, 530, 540, and 550 of the middle resonators 52 to 55. According to the present embodiment, by virtue of the shortest paths 51P and 56P being smaller in length, it is possible to reduce the footprint of the multilayered filter device 1 on the substrate on which the multilayered filter device 1 is to be mounted.

Figure 10:
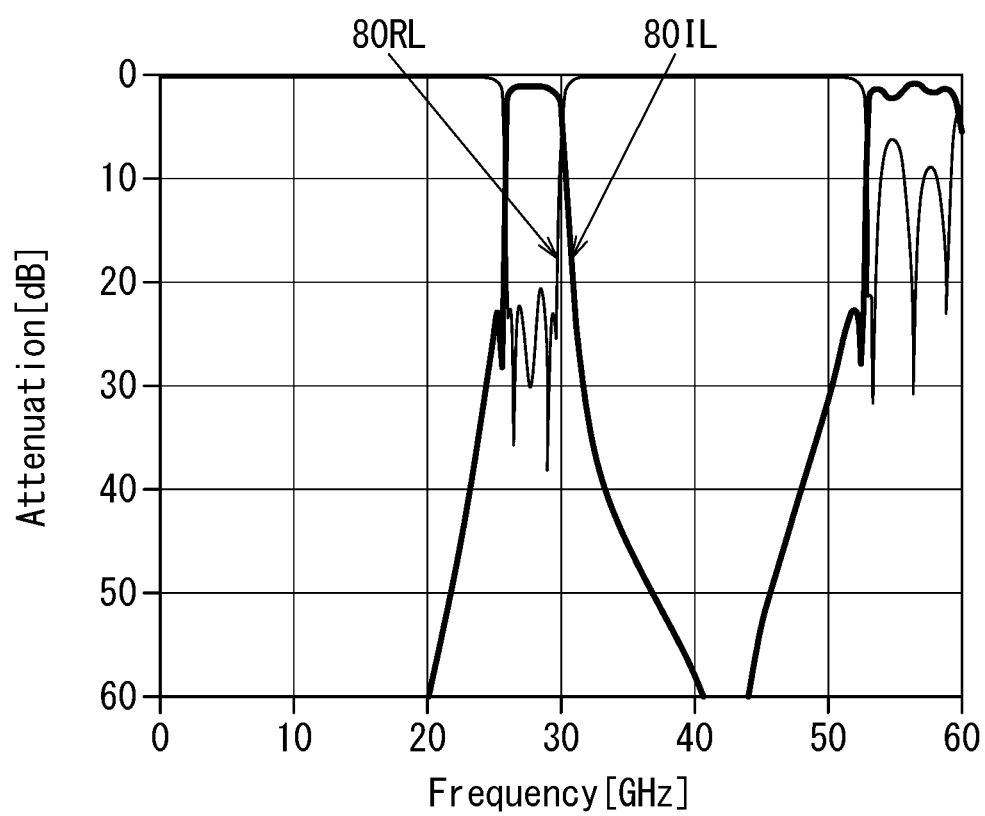
FIG. 10 is a characteristic chart illustrating an example of frequency responses of insertion loss and return loss of a band pass filter of the multilayered filter device according to the first embodiment of the invention.
Figure 11:
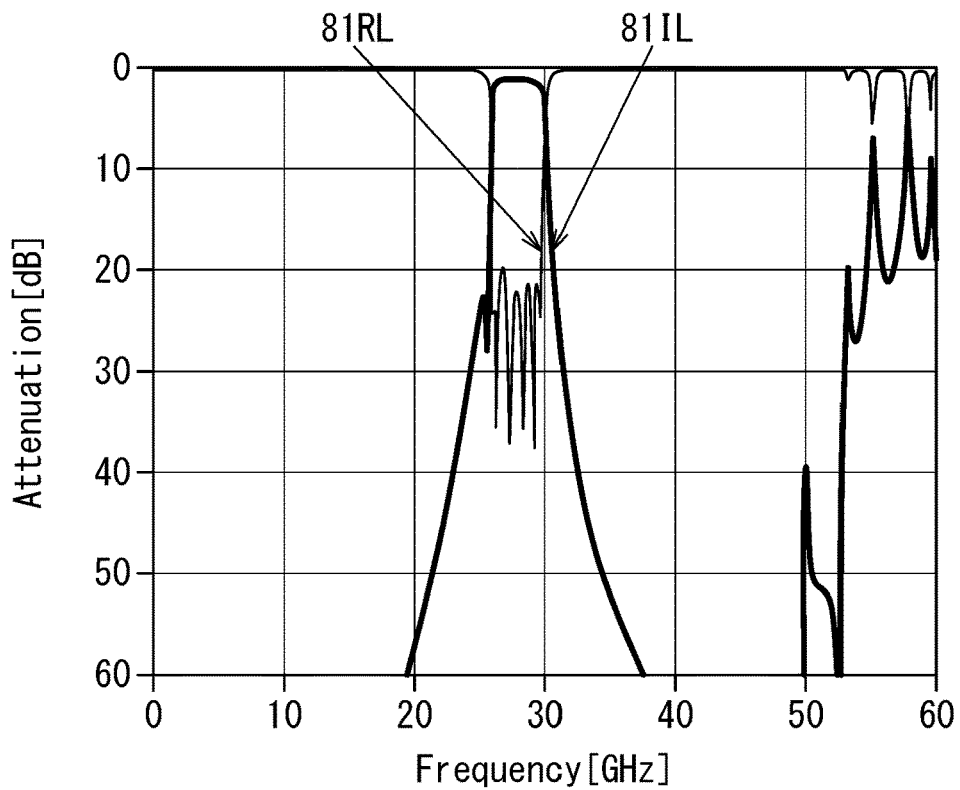
FIG. 11 is a characteristic chart illustrating frequency responses of insertion loss and return loss in a first example of the multilayered filter device.
Figure 12:
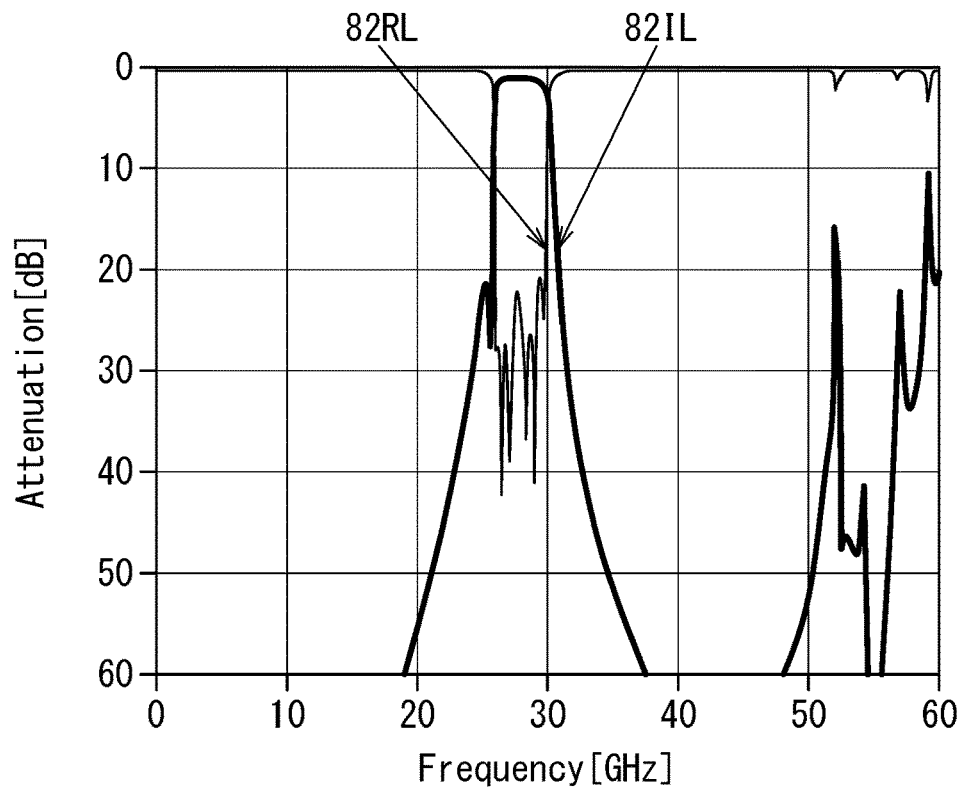
FIG. 12 is a characteristic chart illustrating frequency responses of insertion loss and return loss in a second example of the multilayered filter device.
Figure 13:
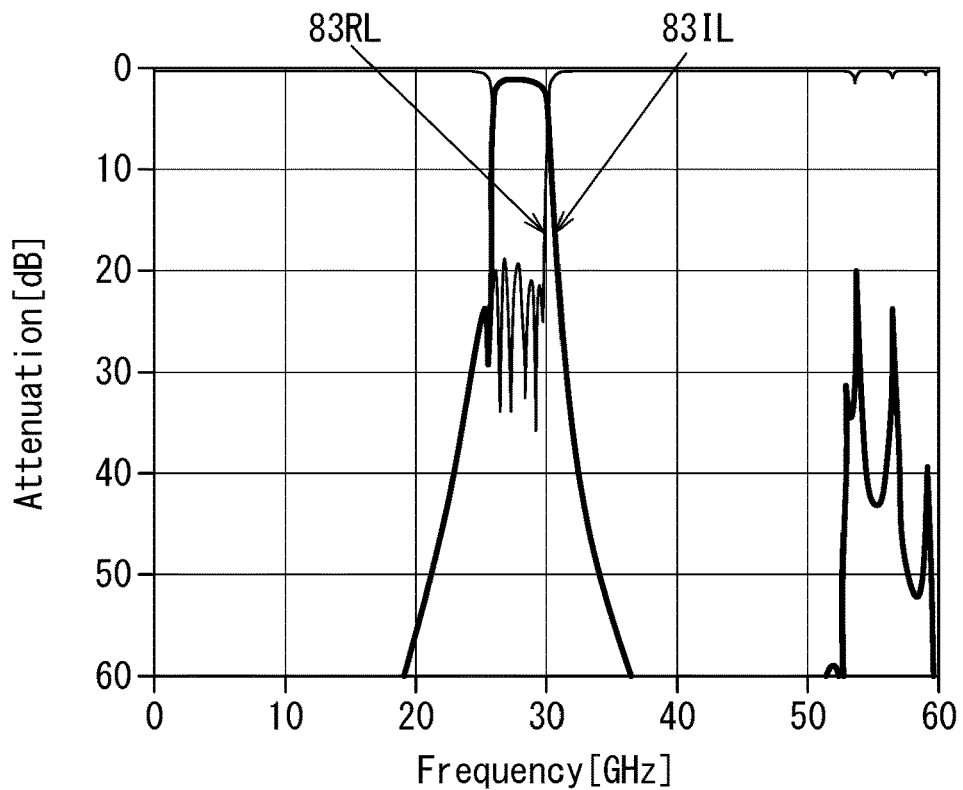
FIG. 13 is a characteristic chart illustrating frequency responses of insertion loss and return loss in a third example of the multilayered filter device.

Now, the foregoing features will be described in detail with reference to simulation results. FIG. 10 illustrates an example of frequency responses of insertion loss and return loss of the band pass filter 15. FIG. 11 illustrates frequency responses of insertion loss and return loss in a first example of the multilayered filter device 1. FIG. 12 illustrates frequency responses of insertion loss and return loss in a second example of the multilayered filter device 1. FIG. 13 illustrates frequency responses of insertion loss and return loss in a third example of the multilayered filter device 1. The frequency responses of insertion loss and return loss illustrated in FIG. 10 to FIG. 13 were obtained by simulation.

Hereinafter, the values of the insertion loss and return loss will collectively be referred to as attenuation. In FIG. 10 to FIG. 13, the horizontal axis represents frequency, and the vertical axis represents attenuation. In FIG. 10, the curve 80IL represents the frequency response of insertion loss, and the curve 80RL represents the frequency response of return loss. In FIG. 11, the curve 81IL represents the frequency response of insertion loss, and the curve 81RL represents the frequency response of return loss. In FIG. 12, the curve 82IL represents the frequency response of insertion loss, and the curve 82RL represents the frequency response of return loss. In FIG. 13, the curve 83IL represents the frequency response of insertion loss, and the curve 83RL represents the frequency response of return loss.

The frequency response 80IL of insertion loss of the band pass filter 15 illustrated in FIG. 10 corresponds to the frequency response of insertion loss of the multilayered filter device 1 in the case without the first and second band elimination filters 10A and 10B, that is, the insertion loss between the first input/output port 3 and the second input/output port 4. The frequency response 80RL of return loss of the band pass filter 15 illustrated in FIG. 10 corresponds to the frequency response of return loss of the multilayered filter device 1 in the case without the first and second band elimination filters 10A and 10B. Each of the frequency responses 81IL, 82IL, and 83IL of insertion loss illustrated in FIG. 11 to FIG. 13 is the frequency response of the insertion loss between the first input/output port 3 and the second input/output port 4.

In the first example, the impedance of each of the resonators 12A and 12B was set to 50 ohms. In the second example, the impedance of each of the resonators 12A and 12B was set to 35 ohms. In the third example, the impedance of each of the resonators 12A and 12B was set to 20 ohms.

In the examples illustrated in FIG. 10 to FIG. 13, the band pass filters 15 were arranged to have substantially the same passband. The passband was set to a frequency band between two frequencies at which the insertion loss is higher by 3 dB than the minimum value thereof. In the examples illustrated in FIG. 10 to FIG. 13, the center frequency of the passband was approximately 28 GHz.

In the examples illustrated in FIG. 10 to FIG. 13, the the shortest paths 51P and 56P were each set to an optimum length. Hereinafter, the optimum length of each of the shortest paths 51P and 56P will be referred to as an optimum shortest path length. The optimum shortest path length was taken as the length of each of the the shortest paths 51P and 56P that maximizes the value of return loss (the attenuation) in the passband of the band pass filter 15.

If FIG. 10 is compared with FIGS. 11 to 13, it is seen that providing the first and second band elimination filters 10A and 10B causes the insertion loss at a frequency twice as high as the center frequency of the passband of the band pass filter 15 to be higher than in the case without the first and second band elimination filters 10A and 10B in the frequency response of insertion loss between the first input/output port 3 and the second input/output port 4.

The optimum shortest path length is 1583 μm in the example illustrated in FIG. 10; 1249 μm in the first example; 1100 μm in the second example; and 854 μm in the third example.

Figure 14:
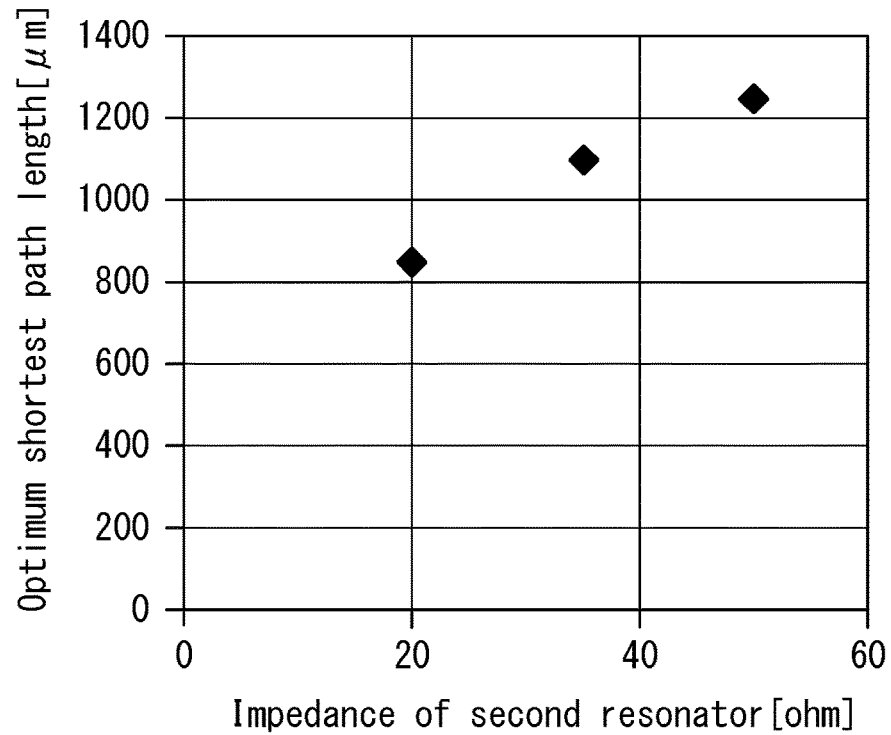
FIG. 14 is a characteristic chart illustrating a relationship between the impedance of a second resonator and an optimum shortest path length in Examples 1 to 3.

FIG. 14 is a characteristic chart illustrating a relationship between the impedance of the second resonator (12A, 12B) in the first to third examples and the optimum shortest path length. In FIG. 14, the horizontal axis represents the impedance of the second resonator, and the vertical axis represents the optimum shortest path length. From FIG. 14, it is seen that the optimum shortest path length varies with the impedance of the second resonator. More specifically, as shown in FIG. 14, the optimum shortest path length becomes longer as the impedance of the second resonator increases. The case without the first and second band elimination filters 10A and 10B is close to a case where the impedance of the second resonator is infinite.

Second Embodiment

A multilayered filter device 100 according to a second embodiment of the invention will now be described. The multilayered filter device 100 has a circuit configuration the same as that of the multilayered filter device 1 according to the first embodiment, which is as illustrated in FIG. 2. The multilayered filter device 100 thus includes a first input/output port 3, a second input/output port 4, a first band elimination filter 10A, a second band elimination filter 10B, and a band pass filter 15.

Figure 15:
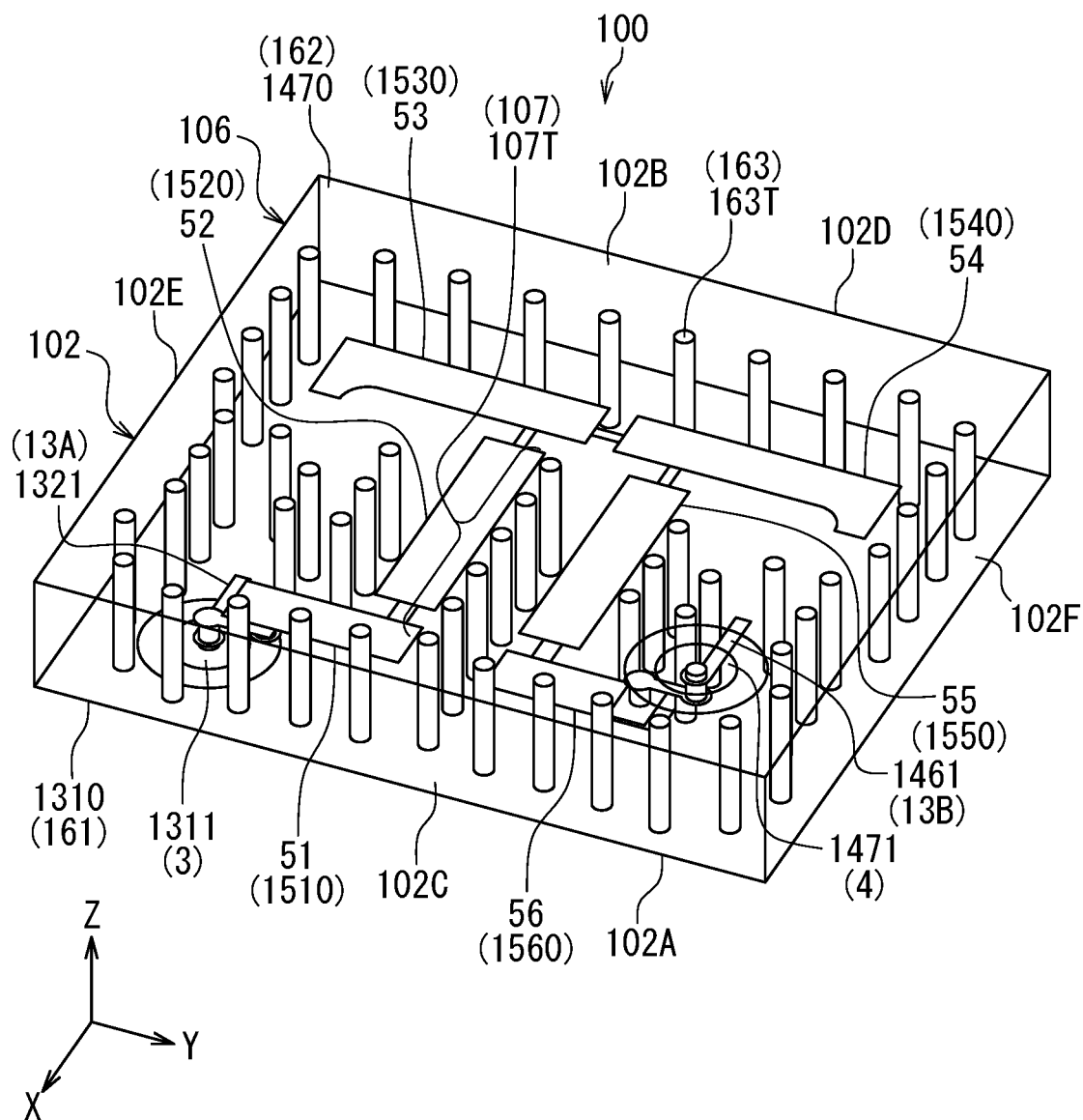
FIG. 15 is a perspective view illustrating a structure of a multilayered filter device according to a second embodiment of the invention.

FIG. 15 is a perspective view illustrating the structure of the multilayered filter device 100. As illustrated in FIG. 15, the multilayered filter device 100 includes a multilayer stack 102. The multilayer stack 102 includes a plurality of dielectric layers and a plurality of conductor layers stacked together. The first input/output port 3 and the second input/output port 4 are integrated with the multilayer stack 102. The first and second band elimination filters 10A and 10B and the band pass filter 15 are constructed using the multilayer stack 102.

The multilayered filter device 100 further includes a shield 106 and a coupling adjustment section 107. The shield 106 is formed of a conductor and integrated with the multilayer stack 102. The shield 106 is connected to ground. The shield 106 has the function of preventing electromagnetic radiation to the surroundings of the multilayered filter device 100. The coupling adjustment section 107 is formed of a conductor, provided within the multilayer stack 102 and electrically connected to the shield 106.

Here, X, Y, and Z directions are defined as illustrated in FIG. 15. The X, Y, and Z directions are orthogonal to one another. In the present embodiment, the direction in which the plurality of dielectric layers are stacked is the Z direction (the upward direction in FIG. 15).

The multilayer stack 102 has a rectangular parallelepiped shape. The multilayer stack 102 has a first end face 102A and a second end face 102B located at opposite ends in the Z direction of the multilayer stack 102, and further has four side surfaces 102C, 102D, 102E, and 102F connecting the first end face 102A and the second end face 102B. The first end face 102A is also the bottom surface of the multilayer stack 102. The second end face 102B is also the top surface of the multilayer stack 102. The side surfaces 102C and 102D are located at opposite ends in the X direction of the multilayer stack 102. The side surfaces 102E and 102F are located at opposite ends in the Y direction of the multilayer stack 102.

The shield 106 includes a first portion 161 and a second portion 162 spaced from each other in the Z direction, and a connecting portion 163 connecting the first portion 161 and the second portion 162. The first portion 161, the second portion 162, and the connecting portion 163 are arranged to surround the six resonators 51 to 56 of the band pass filter 15. The first portion 161 is formed of a conductor layer 1310. The second portion 162 is formed of a conductor layer 1470.

The resonators 51, 52, 53, 54, 55, and 56 respectively include resonator conductor portions 1510, 1520, 1530, 1540, 1550, and 1560 each of which is formed of a line of conductor. Each of the resonator conductor portions 1510, 1520, 1530, 1540, 1550, and 1560 extends in a direction orthogonal to the Z direction.

Each of the resonator conductor portions 1510, 1520, 1530, 1540, 1550, and 1560 has a first end and a second end which are opposite ends of the line and are open. Each of the resonator conductor portions 1510, 1520, 1530, 1540, 1550, and 1560 has a length of one half or nearly one half the wavelength corresponding to the center frequency of the passband of the band pass filter 15.

The coupling adjustment section 107 is intended to adjust the magnitude of the capacitive coupling between the resonators 51 and 56 and the magnitude of the magnetic coupling between the resonators 52 and 55. The coupling adjustment section 107 extends in the Z direction and comes in contact with the first portion 161 and the second portion 162. A portion of the coupling adjustment section 107 extends to pass between the resonator conductor portion 1510 and the resonator conductor portion 1560. Another portion of the coupling adjustment section 107 extends to pass between resonator conductor portion 1520 and the resonator conductor portion 1550.

The coupling adjustment section 107 includes a plurality of series of through holes 107T. In FIG. 15, each series of through holes 107T is represented by a circular column. Each series of through holes 107T includes two or more through holes connected in series. Each series of through holes 107T extends in the Z direction. The plurality of series of through holes 107T are arranged to be adjacent to each other in the X direction. The number of the plurality of series of through holes 107T is six in the present embodiment.

The connecting portion 163 of the shield 106 includes a plurality of series of through hole 163T. In FIG. 15, each series of through holes 163T is represented by a circular column. All the series of through holes represented by circular columns in FIG. 15 except the six series of through holes 107T are the series of through holes 163T. Each series of through holes 163T includes two or more through holes connected in series. Each series of the through holes 163T extends in the Z direction.

Figure 28:
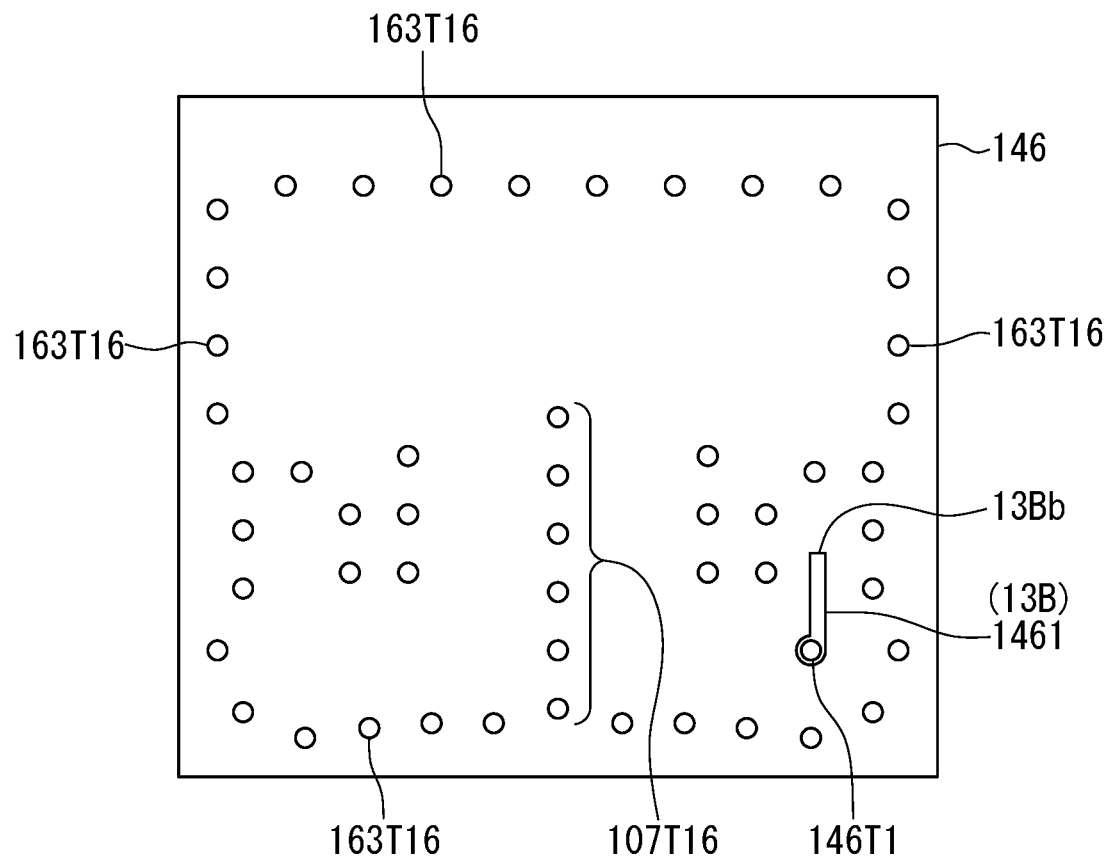
FIG. 28 is an explanatory diagram illustrating a first patterned surface of a sixteenth dielectric layer of the multilayer stack illustrated in FIG. 15.
Figure 29:
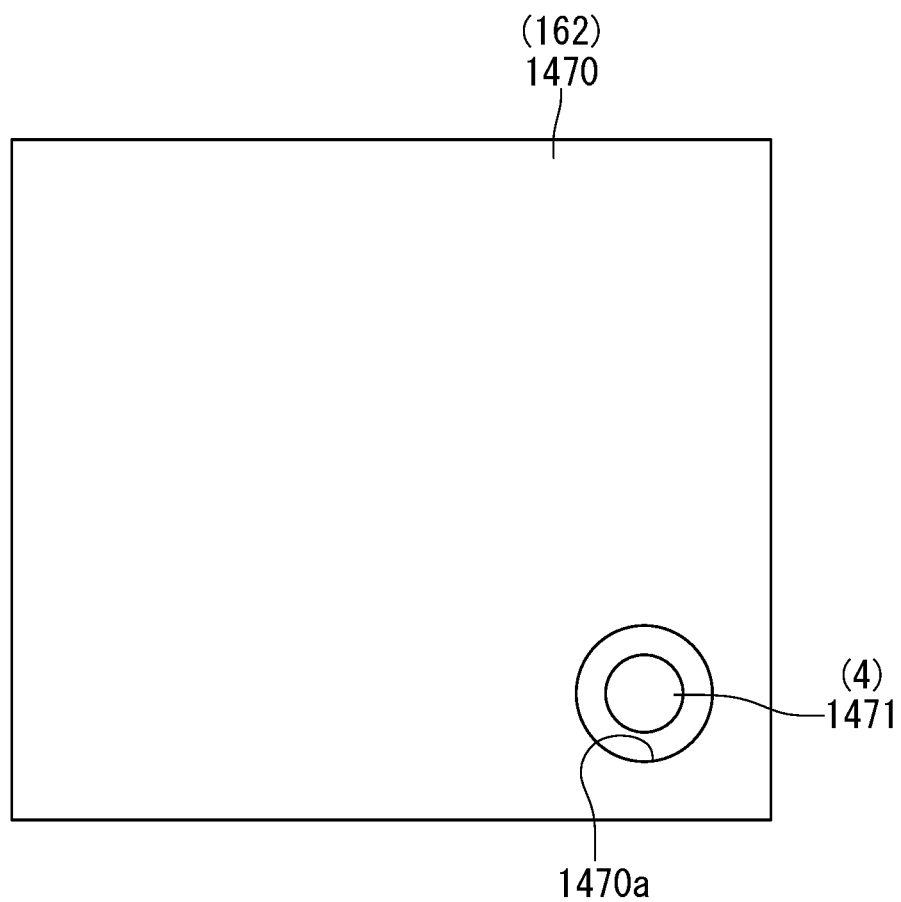
FIG. 29 is an explanatory diagram illustrating a second patterned surface of the sixteenth dielectric layer of the multilayer stack illustrated in FIG. 15.

Reference is now made to FIG. 17 to FIG. 29 to describe an example of the dielectric layers constituting the multilayer stack 102 and the configuration of a plurality of conductor layers formed on the dielectric layers and a plurality of through holes formed in the dielectric layers. In this example, the multilayer stack 102 includes sixteen dielectric layers stacked together. The sixteen dielectric layers will be referred to as a first to a sixteenth dielectric layer in the order from bottom to top. The first to sixteenth dielectric layers are denoted by reference numerals 131 to 146, respectively. In FIG. 17 to FIG. 27, the patterned surface of each dielectric layer is the bottom surface of the dielectric layer. In FIG. 17 to FIG. 27, the conductor layers formed on the patterned surface are illustrated as viewed from the top surface of the dielectric layer. The sixteenth dielectric layer 146 has a first patterned surface serving as the bottom surface of the dielectric layer 146 and a second patterned surface serving as the top surface of the dielectric layer 146. In FIG. 28, the conductor layer formed on the first patterned surface is illustrated as viewed from the top surface of the dielectric layer 146. FIG. 29 illustrates the second patterned surface. In FIG. 17 to FIG. 28, each circle represents a through hole.

Figure 17:
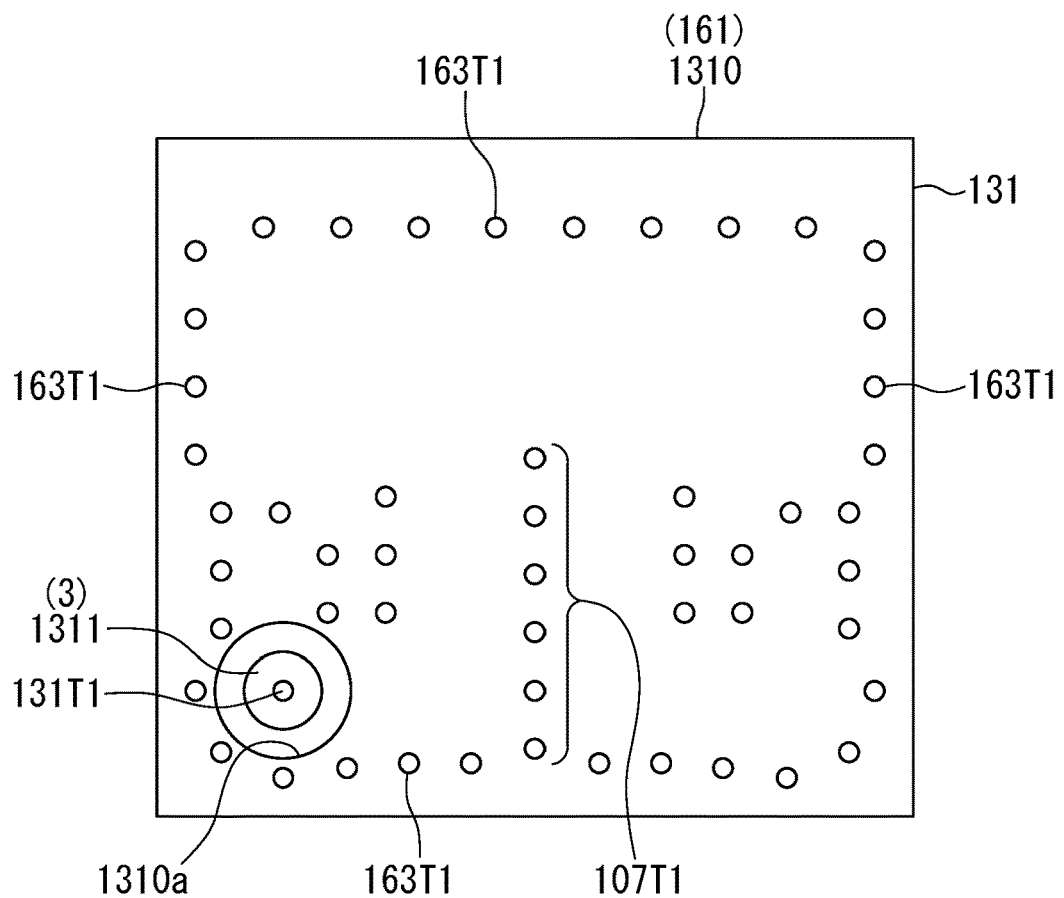
FIG. 17 is an explanatory diagram illustrating a patterned surface of a first dielectric layer of the multilayer stack illustrated in FIG. 15.

FIG. 17 illustrates a patterned surface of the first dielectric layer 131. On the patterned surface of the first dielectric layer 131, there are formed the conductor layer 1310 forming the first portion 161 of the shield 106, and a conductor layer 1311 forming the first input/output port 3. A circular hole 1310a is formed in the conductor layer 1310. The conductor layer 1311 is formed inside the hole 1310a and is not in contact with the conductor layer 1310.

Further, a through hole 131T1 connected to the conductor layer 1311, six through holes 107T1 constituting respective portions of the six series of through holes 107T, and a plurality of through holes 163T1 constituting respective portions of the plurality of series of through holes 163T are formed in the dielectric layer 131. All the through holes represented by circles in FIG. 17 except the through holes 131T1 and 107T1 are the through holes 163T1. The through holes 107T1 and 163T1 are connected to the conductor layer 1310.

Figure 18:
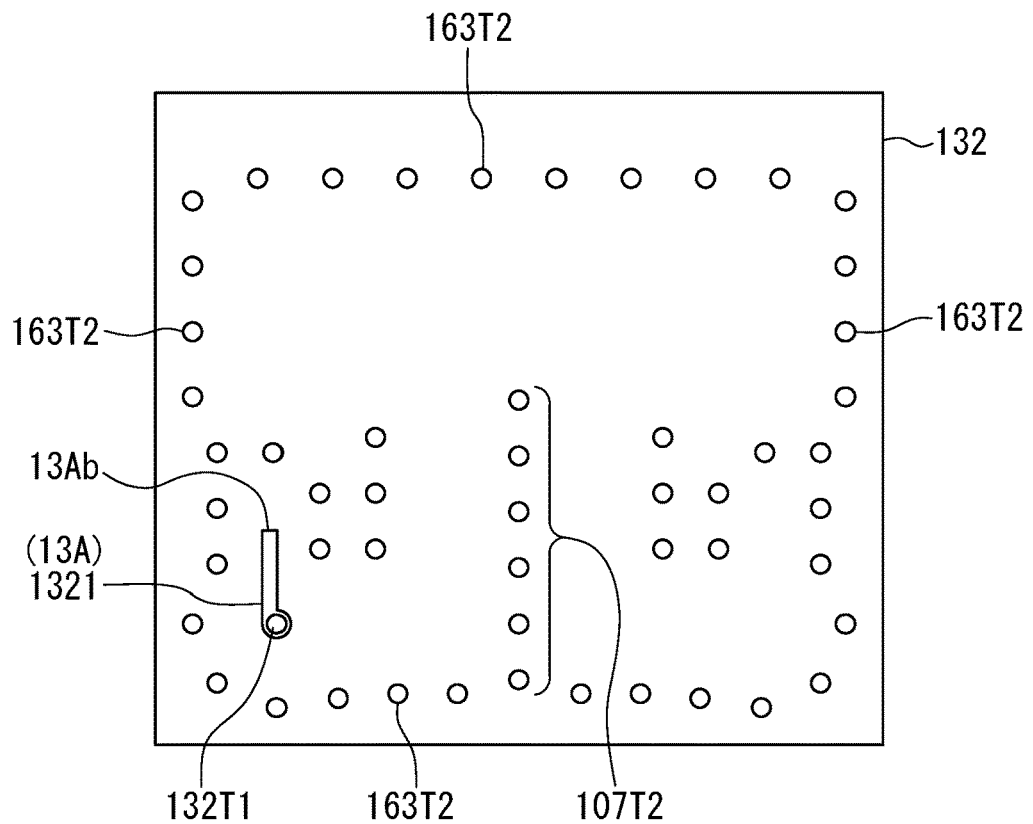
FIG. 18 is an explanatory diagram illustrating a patterned surface of a second dielectric layer of the multilayer stack illustrated in FIG. 15.

FIG. 18 illustrates a patterned surface of the second dielectric layer 132. A conductor layer 1321 forming the conductor line 13A is formed on the patterned surface of the dielectric layer 132. The conductor layer 1321 has a first end and a second end 13Ab opposite to each other. A portion of the conductor layer 1321 near the second end 13Ab is opposed to the conductor layer 1310 illustrated in FIG. 17 with the dielectric layer 131 interposed therebetween.

In the dielectric layer 132, there is formed a through hole 132T1 connected to a portion of the conductor layer 1321 near the first end thereof. The through hole 131T1 formed in the first dielectric layer 131 is connected to the through hole 132T1. Further formed in the dielectric layer 132 are six through holes 107T2 constituting respective portions of the six series of through holes 107T. The six through holes 107T1 illustrated in FIG. 17 are respectively connected to the six through holes 107T2.

Further formed in the dielectric layer 132 are a plurality of through holes 163T2 constituting respective portions of the plurality of series of through holes 163T. All the through holes represented by circles in FIG. 18 except the through holes 132T1 and 107T1 are the through holes 163T2. The plurality of through holes 163T1 illustrated in FIG. 17 are respectively connected to the plurality of through holes 163T2.

Figure 19:
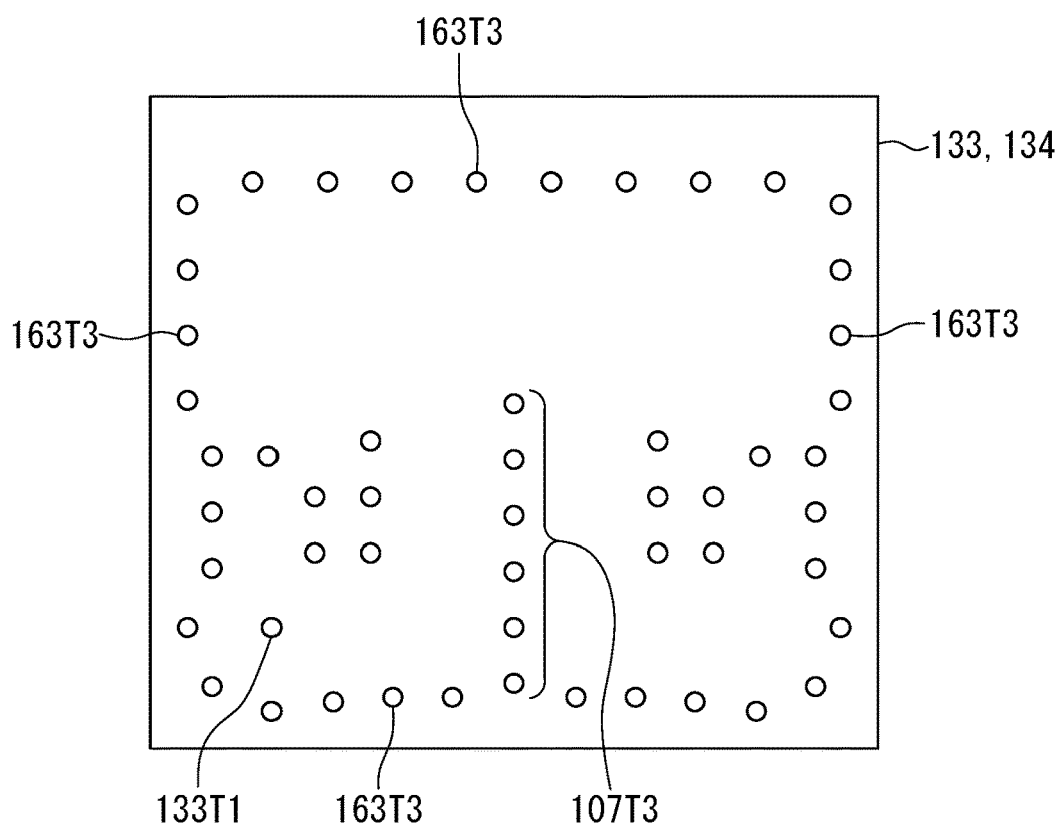
FIG. 19 is an explanatory diagram illustrating a patterned surface of each of a third and a fourth dielectric layer of the multilayer stack illustrated in FIG. 15.

FIG. 19 illustrates a patterned surface of each of the third and fourth dielectric layers 133 and 134. A through hole 133T1 is formed in each of the dielectric layers 133 and 134. The through hole 132T1 illustrated in FIG. 18 is connected to the through hole 133T1 formed in the third dielectric layer 133.

Further formed in each of the dielectric layers 133 and 134 are six through holes 107T3 constituting respective portions of the six series of through holes 107T. The six through holes 107T2 illustrated in FIG. 18 are respectively connected to the six through holes 107T3 formed in the third dielectric layer 133.

Further, a plurality of through holes 163T3 constituting respective portions of the plurality of series of through holes 163T are formed in each of the dielectric layers 133 and 134. All the through holes represented by circles in FIG. 19 except the through holes 133T1 and 107T3 are the through holes 163T3. The plurality of through holes 163T2 illustrated in FIG. 18 are respectively connected to the plurality of through holes 163T3 formed in the third dielectric layer 133.

In the dielectric layers 133 and 134, every vertically adjacent through holes denoted by the same reference signs are connected to each other.

Figure 20:
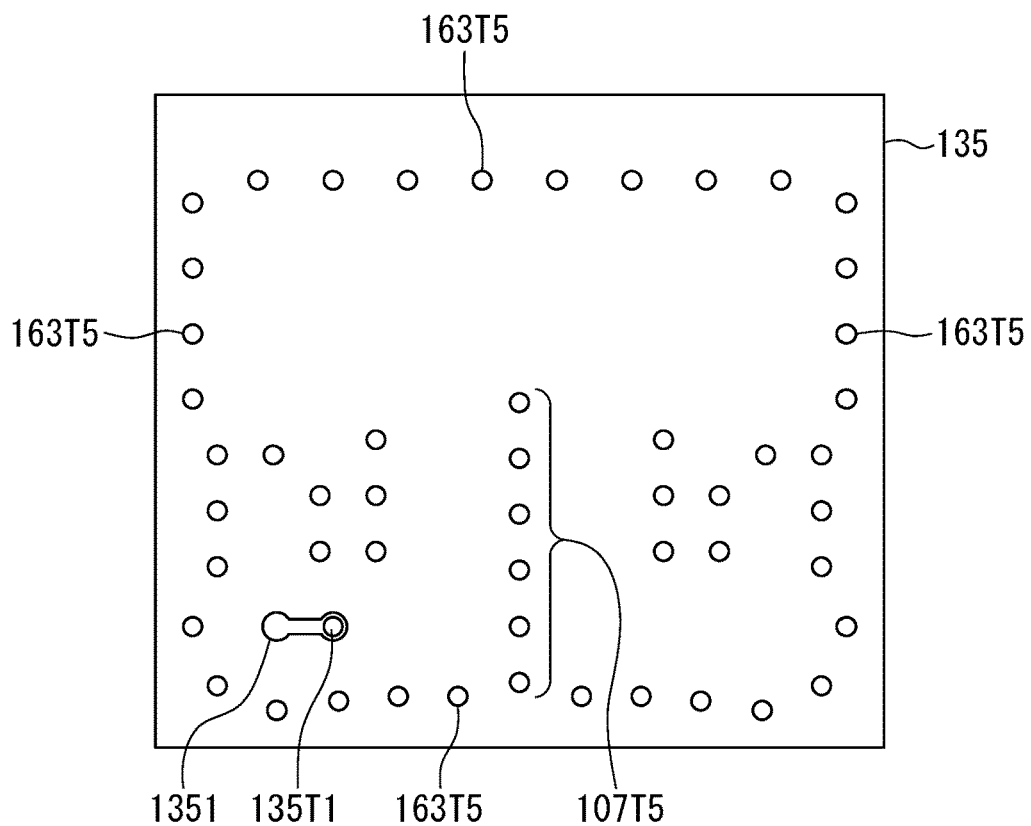
FIG. 20 is an explanatory diagram illustrating a patterned surface of a fifth dielectric layer of the multilayer stack illustrated in FIG. 15.

FIG. 20 illustrates a patterned surface of the fifth dielectric layer 135. A conductor layer 1351 is formed on the patterned surface of the dielectric layer 135. The through hole 133T1 formed in the fourth dielectric layer 134 is connected to the conductor layer 1351.

Further, a through hole 135T1 connected to the conductor layer 1351 is formed in the dielectric layer 135. Further formed in the dielectric layer 135 are six through holes 107T5 constituting respective portions of the six series of through holes 107T. The six through holes 107T3 formed in the fourth dielectric layer 134 are respectively connected to the six through holes 107T5.

Further formed in the dielectric layer 135 are a plurality of through holes 163T5 constituting respective portions of the plurality of series of through holes 163T. All the through holes represented by circles in FIG. 20 except the through holes 135T1 and 107T5 are the through holes 163T5. The plurality of through holes 163T3 formed in the fourth dielectric layer 134 are respectively connected to the plurality of through holes 163T5.

Figure 21:
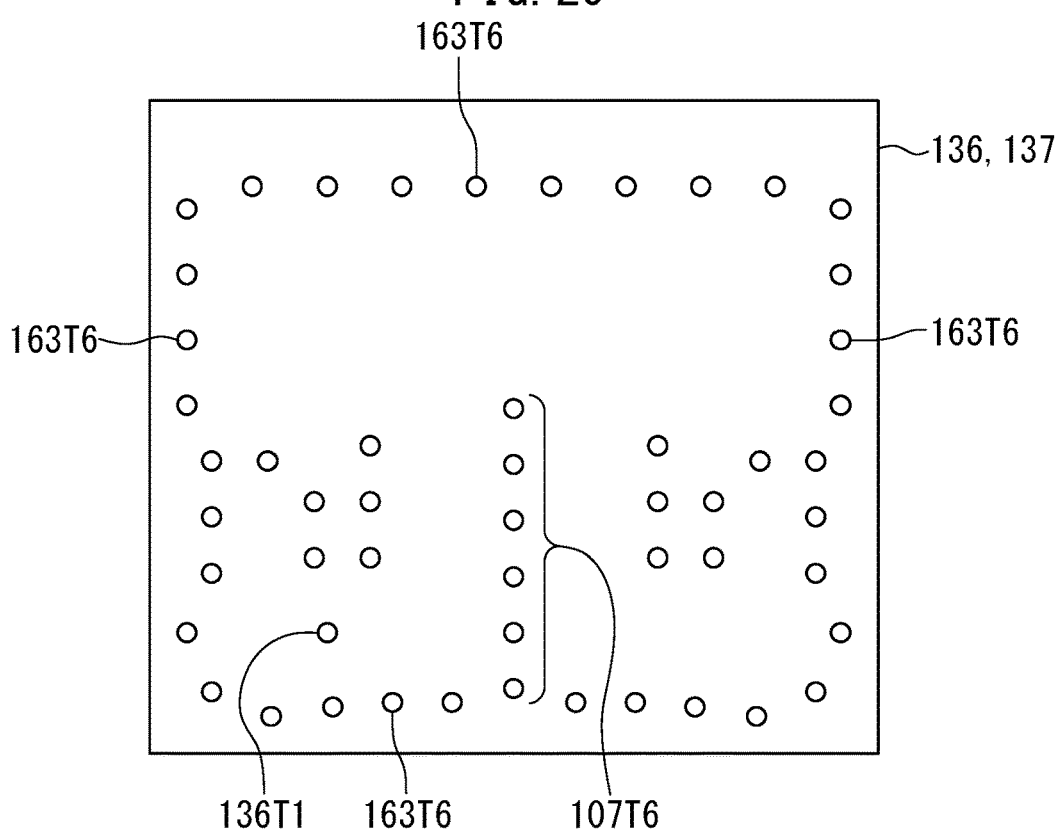
FIG. 21 is an explanatory diagram illustrating a patterned surface of each of a sixth and a seventh dielectric layer of the multilayer stack illustrated in FIG. 15.

FIG. 21 illustrates a patterned surface of each of the sixth and seventh dielectric layers 136 and 137. A through hole 136T1 is formed in each of the dielectric layers 136 and 137. The through hole 135T1 illustrated in FIG. 20 is connected to the through hole 136T1 formed in the sixth dielectric layer 136.

Further formed in each of the dielectric layers 136 and 137 are six through holes 107T6 constituting respective portions of the six series of through holes 107T. The six through holes 107T5 illustrated in FIG. 20 are respectively connected to the six through holes 107T6 formed in the sixth dielectric layer 136.

Further, a plurality of through holes 163T6 constituting respective portions of the plurality of series of through holes 163T are formed in each of the dielectric layers 136 and 137. All the through holes represented by circles in FIG. 21 except the through holes 136T1 and 107T6 are the through holes 163T6. The plurality of through holes 163T5 illustrated in FIG. 20 are respectively connected to the plurality of through holes 163T6 formed in the sixth dielectric layer 136.

In the dielectric layers 136 and 137, every vertically adjacent through holes denoted by the same reference signs are connected to each other.

Figure 22:
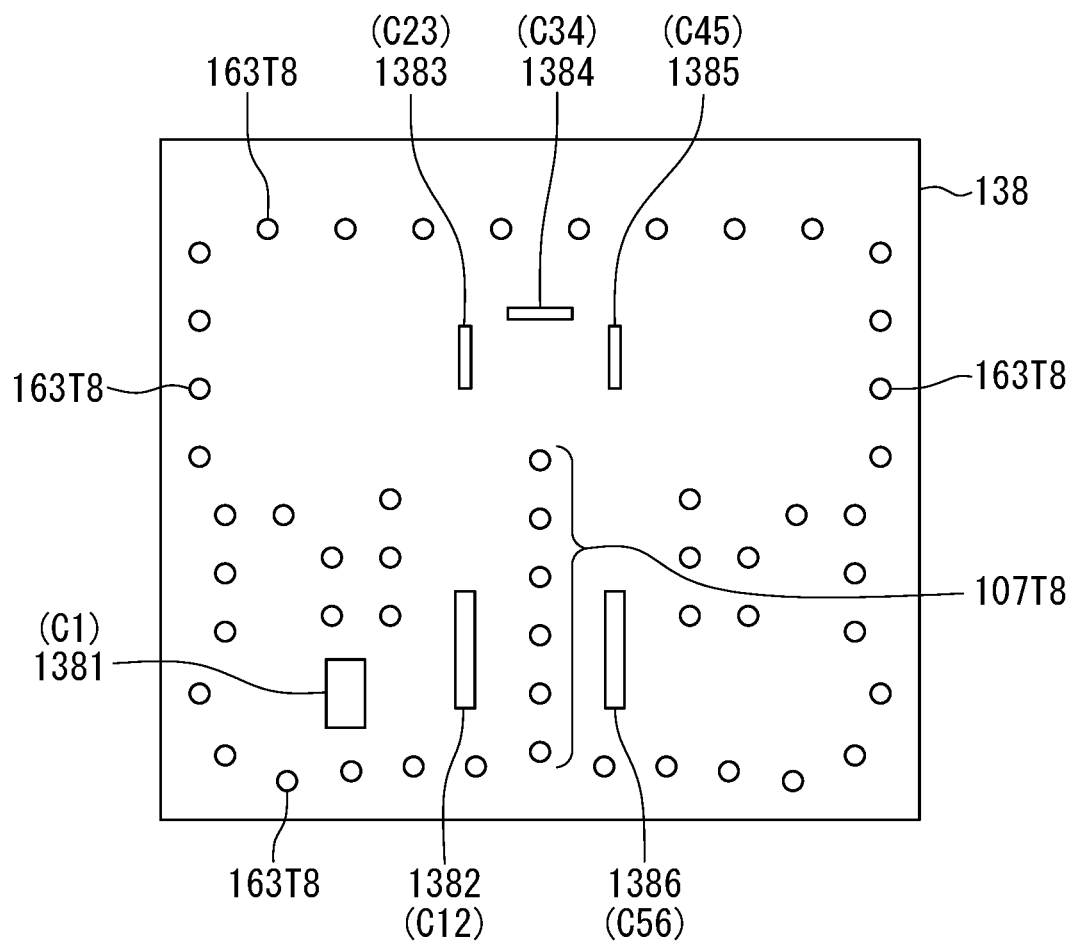
FIG. 22 is an explanatory diagram illustrating a patterned surface of an eighth dielectric layer of the multilayer stack illustrated in FIG. 15.

FIG. 22 illustrates a patterned surface of the eighth dielectric layer 138. A conductor layer 1381 for forming the capacitor C1 illustrated in FIG. 2 is formed on the patterned surface of the dielectric layer 138. The though hole 136T1 formed in the seventh dielectric layer 137 is connected to the conductor layer 1381.

On the patterned surface of the dielectric layer 138, there are further formed conductor layers 1382, 1383, 1384, 1385, and 1386 for forming the capacitors C12, C23, C34, C45, and C56 illustrated in FIG. 2, respectively.

Further, six through holes 107T8 constituting respective portions of the six series of through holes 107T are formed in the dielectric layer 138. The six through holes 107T6 formed in the seventh dielectric layer 137 are respectively connected to the six through holes 107T8.

Further formed in the dielectric layer 138 are a plurality of through holes 163T8 constituting respective portions of the plurality of series of through holes 163T. All the through holes represented by circles in FIG. 22 except the six through holes 107T8 are the through holes 163T8. The plurality of through holes 163T6 formed in the seventh dielectric layer 137 are respectively connected to the plurality of through holes 163T8.

Figure 23:
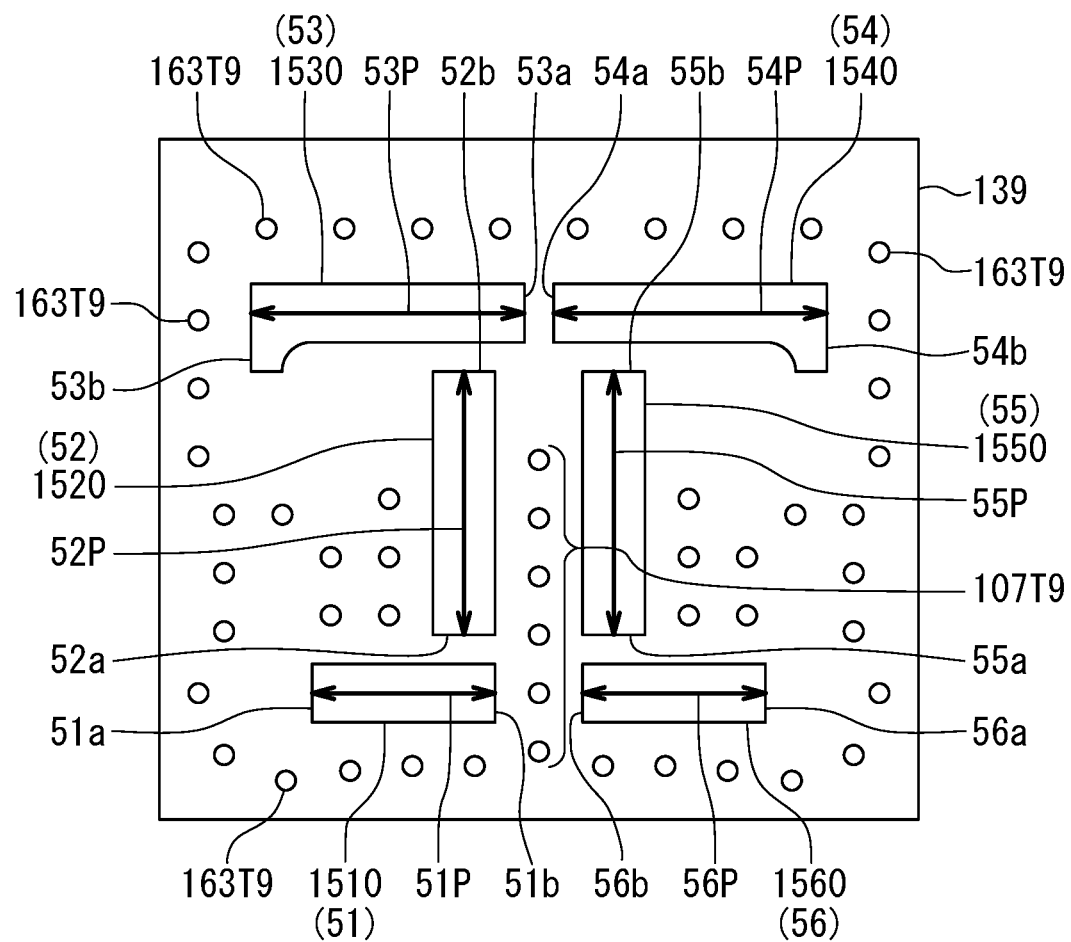
FIG. 23 is an explanatory diagram illustrating a patterned surface of a ninth dielectric layer of the multilayer stack illustrated in FIG. 15.

FIG. 23 illustrates a patterned surface of the ninth dielectric layer 139. The resonator conductor portions 1510, 1520, 1530, 1540, 1550, and 1560 are formed on the patterned surface of the dielectric layer 139. The resonator conductor portion 1510 has a first end 51$a$ and a second end 51$b$ which are opposite ends of the line. The resonator conductor portion 1520 has a first end 52$a$ and a second end 52$b$ which are opposite ends of the line. The resonator conductor portion 1530 has a first end 53$a$ and a second end 53$b$ which are opposite ends of the line. The resonator conductor portion 1540 has a first end 54$a$ and a second end 54$b$ which are opposite ends of the line. The resonator conductor portion 1550 has a first end 55$a$ and a second end 55$b$ which are opposite ends of the line. The resonator conductor portion 1560 has a first end 56$a$ and a second end 56$b$ which are opposite ends of the line.

The thick arrows in FIG. 23 represent shortest paths 51P, 52P, 53P, 54P, 55P, and 56P connecting the respective first and second ends of the resonator conductor portions 1510, 1520, 1530, 1540, 1550, and 1560.

The resonator conductor portions 1510 and 1560 each extend in the Y direction. The resonator conductor portions 1510 and 1560 are arranged in such a positional relationship that a single straight line extending in the Y direction intersects the resonator conductor portions 1510 and 1560. The second end 51$b$ of the resonator conductor portion 1510 and the second end 56b of the resonator conductor portion 1560 are adjacent to each other with a predetermined distance therebetween. The distance between the second end 51b and the second end 56b is sufficiently smaller than the length of each of the resonator conductor portions 1510 and 1560.

The resonator conductor portions 1520 and 1550 each extend in the X direction. The resonator conductor portions 1520 and 1550 are adjacent to each other in the Y direction with a predetermined distance therebetween. The distance between the resonator conductor portions 1520 and 1550 is sufficiently smaller than the length of each of the resonator conductor portions 1520 and 1550.

The first end 52a of the resonator conductor portion 1520 is located near the second end 51b of the resonator conductor portion 1510. The first end 55a of the resonator conductor portion 1550 is located near the second end 56b of the resonator conductor portion 1560.

The resonator conductor portions 1530 and 1540 each extend in the Y direction. The resonator conductor portions 1530 and 1540 are arranged in such a positional relationship that a single straight line extending in the Y direction intersects the resonator conductor portions 1530 and 1540. The first end 53a of the resonator conductor portion 1530 and the first end 54a of the resonator conductor portion 1540 are adjacent to each other with a predetermined distance therebetween. The distance between the first end 53a and the first end 54a is sufficiently smaller than the length of each of the resonator conductor portions 1530 and 1540. The first end 53a is located near the second end 52b of the resonator conductor portion 1520. The first end 54a is located near the second end 55b the resonator conductor portion 1550.

Further, six through holes 107T9 constituting respective portions of the six series of through holes 107T are formed in the dielectric layer 139. The six through holes 107T8 illustrated in FIG. 22 are respectively connected to the six through holes 107T9.

Further formed in the dielectric layer 139 are a plurality of through holes 163T9 constituting respective portions of the plurality of series of through holes 163T. All the through holes represented by circles in FIG. 23 except the six through holes 107T9 are the through holes 163T9. The plurality of through holes 163T8 illustrated in FIG. 22 are respectively connected to the plurality of through holes 163T9.

Figure 24:
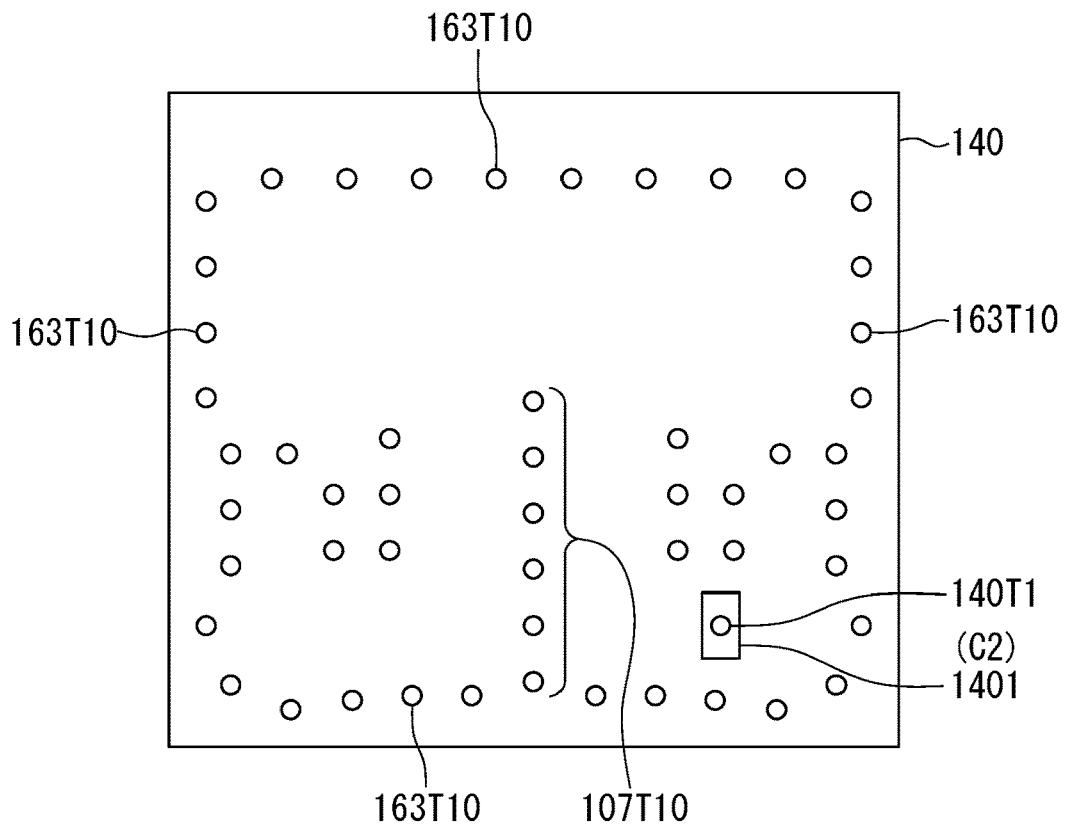
FIG. 24 is an explanatory diagram illustrating a patterned surface of a tenth dielectric layer of the multilayer stack illustrated in FIG. 15.

FIG. 24 illustrates a patterned surface of the tenth dielectric layer 140. A conductor layer 1401 for forming the capacitor C2 illustrated in FIG. 2 is formed on the patterned surface of the dielectric layer 140.

In the dielectric layer 140, there is formed a through hole 140T1 connected to the conductor layer 1401. Further formed in the dielectric layer 140 are six through holes 107T10 constituting respective portions of the six series of through holes 107T. The six through holes 107T9 illustrated in FIG. 23 are respectively connected to the six through holes 107T10.

Further formed in the dielectric layer 140 are a plurality of through holes 163T10 constituting respective portions of the plurality of series of through holes 163T. All the through holes represented by circles in FIG. 24 except the through holes 140T1 and 107T10 are the through holes 163T10. The plurality of through holes 163T9 illustrated in FIG. 23 are respectively connected to the plurality of through holes 163T10.

Figure 25:
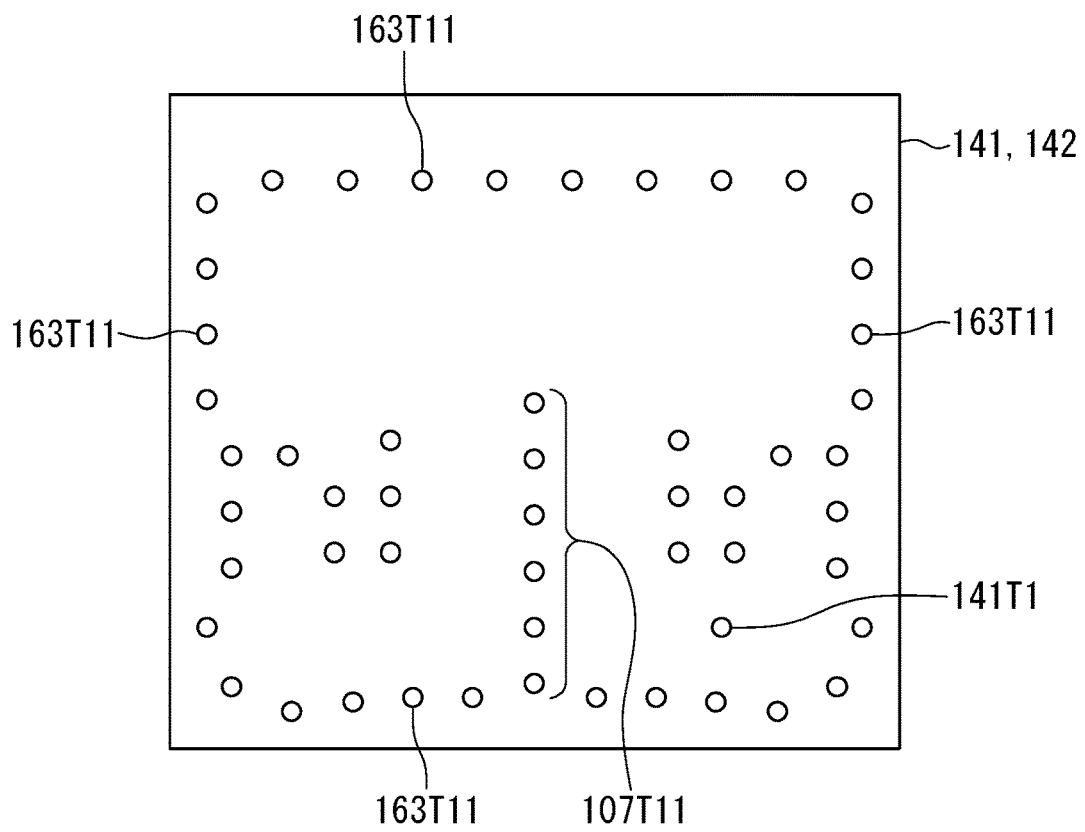
FIG. 25 is an explanatory diagram illustrating a patterned surface of each of an eleventh and a twelfth dielectric layer of the multilayer stack illustrated in FIG. 15.

FIG. 25 illustrates a patterned surface of each of the eleventh and twelfth dielectric layers 141 and 142. A through hole 141T1 is formed in each of the dielectric layers 141 and 142. The through hole 140T1 illustrated in FIG. 24 is connected to the through hole 141T1 formed in the eleventh dielectric layer 141.

Further formed in each of the dielectric layers 141 and 142 are six through holes 107T11 constituting respective portions of the six series of through holes 107T. The six through holes 107T10 illustrated in FIG. 24 are respectively connected to the six through holes 107T11 formed in the eleventh dielectric layer 141.

Further, a plurality of through holes 163T11 constituting respective portions of the plurality of series of through holes 163T are formed in each of the dielectric layers 141 and 142. All the through holes represented by circles in FIG. 25 except the through holes 141T1 and 107T11 are the through holes 163T11. The plurality of through holes 163T10 illustrated in FIG. 24 are respectively connected to the plurality of through holes 163T11 formed in the eleventh dielectric layer 141.

In the dielectric layers 141 and 142, every vertically adjacent through holes denoted by the same reference signs are connected to each other.

Figure 26:
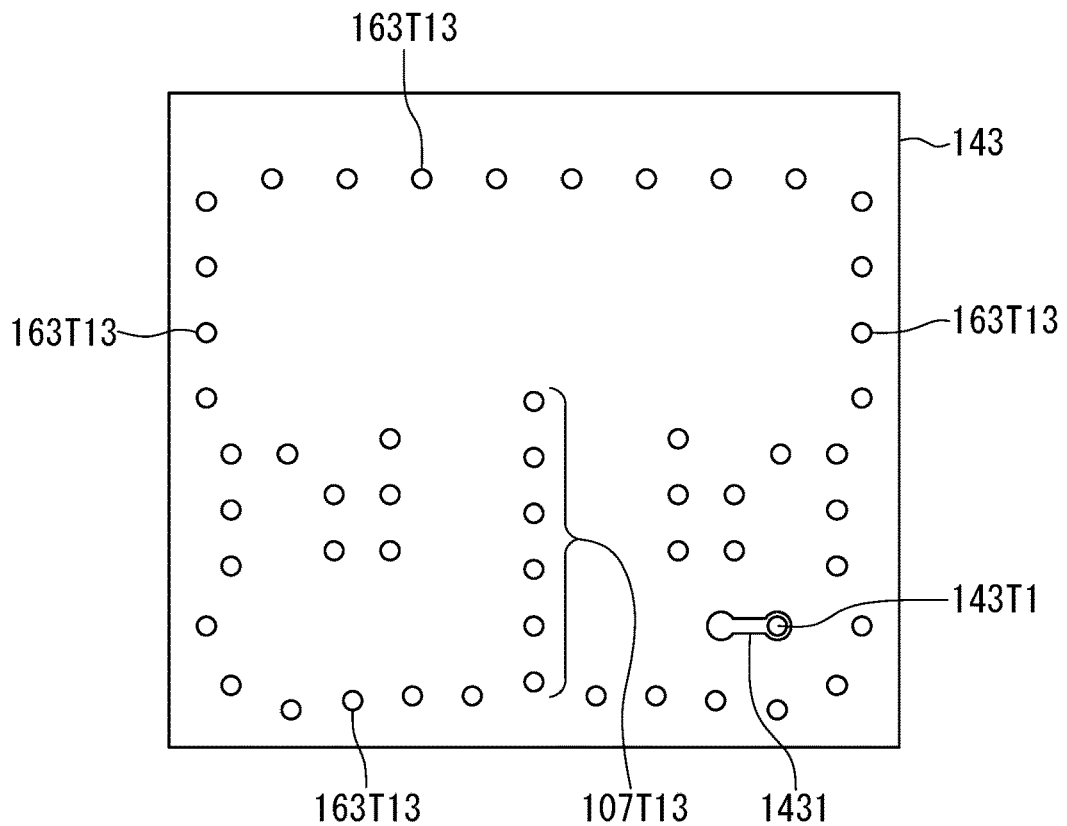
FIG. 26 is an explanatory diagram illustrating a patterned surface of a thirteenth dielectric layer of the multilayer stack illustrated in FIG. 15.

FIG. 26 illustrates a patterned surface of the thirteenth dielectric layer 143. A conductor layer 1431 is formed on the patterned surface of the dielectric layer 143. The through hole 141T1 formed in the twelfth dielectric layer 142 is connected to the conductor layer 1431.

Further, a through hole 143T1 connected to the conductor layer 1431 is formed in the dielectric layer 143. Further formed in the dielectric layer 143 are six through holes 107T13 constituting respective portions of the six series of through holes 107T. The six through holes 107T11 formed in the twelfth dielectric layer 142 are respectively connected to the six through holes 107T13.

Further formed in the dielectric layer 143 are a plurality of through holes 163T13 constituting respective portions of the plurality of series of through holes 163T. All the through holes represented by circles in FIG. 26 except the through holes 143T1 and 107T13 are the through holes 163T13. The plurality of through holes 163T11 formed in the twelfth dielectric layer 142 are respectively connected to the plurality of through holes 163T13.

Figure 27:
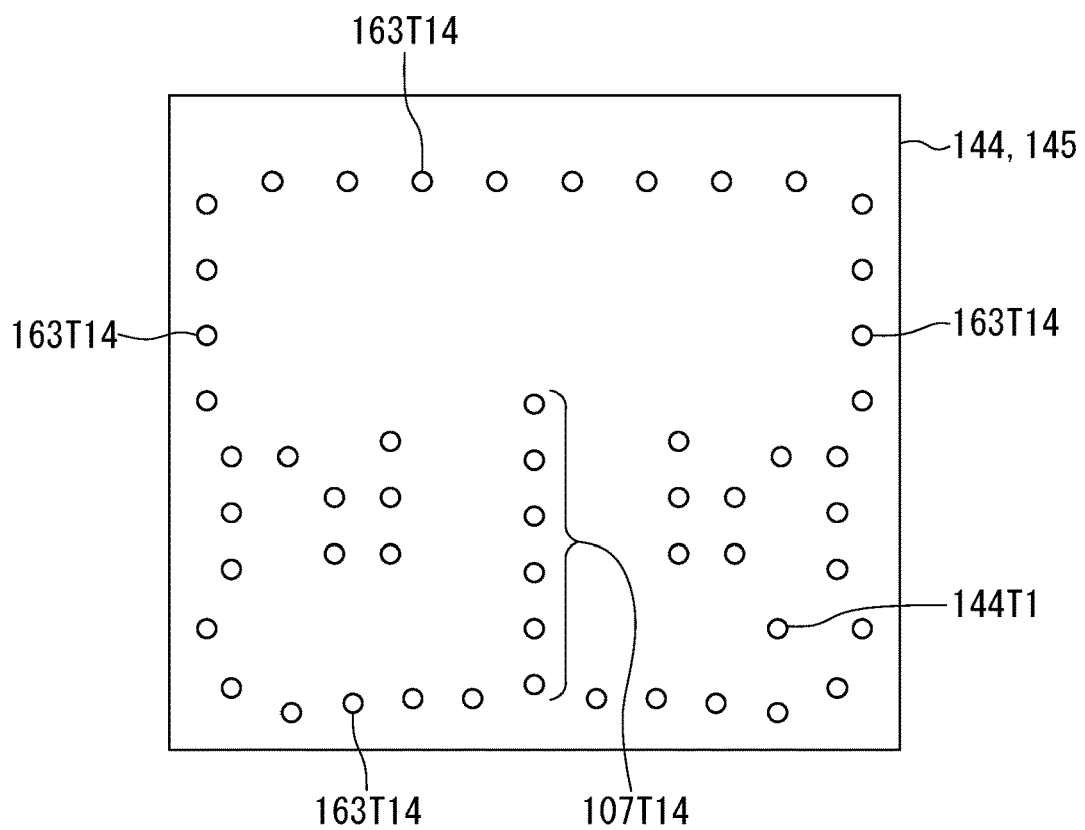
FIG. 27 is an explanatory diagram illustrating a patterned surface of each of a fourteenth and a fifteenth dielectric layer of the multilayer stack illustrated in FIG. 15.

FIG. 27 illustrates a patterned surface of each of the fourteenth and fifteenth dielectric layers 144 and 145. A through hole 144T1 is formed in each of the dielectric layers 144 and 145. The through hole 143T1 illustrated in FIG. 26 is connected to the through hole 144T1 formed in the fourteenth dielectric layer 144.

Further formed in each of the dielectric layers 144 and 145 are six through holes 107T14 constituting respective portions of the six series of through holes 107T. The six through holes 107T13 illustrated in FIG. 26 are respectively connected to the six through holes 107T14 formed in the fourteenth dielectric layer 144.

Further, a plurality of through holes 163T14 constituting respective portions of the plurality of series of through holes 163T are formed in each of the dielectric layers 144 and 145. All the through holes represented by circles in FIG. 27 except the through holes 144T1 and 107T14 are the through holes 163T14. The plurality of through holes 163T13 illustrated in FIG. 26 are respectively connected to the plurality of through holes 163T14 formed in the fourteenth dielectric layer 144.

In the dielectric layers 144 and 145, every vertically adjacent through holes denoted by the same reference signs are connected to each other.

FIG. 28 illustrates the first patterned surface of the sixteenth dielectric layer 146. A conductor layer 1461 forming the conductor line 13B is formed on the first patterned surface of the dielectric layer 146. The conductor layer 1461 has a first end and a second end 13Bb opposite to each other.

In the dielectric layer 146, there is formed a through hole 146T1 connected to a portion of the conductor layer 1461 near the first end thereof. The through hole 144T1 formed in the fifteenth dielectric layer 145 is connected to the through hole 146T1. Further formed in the dielectric layer 146 are six through holes 107T16 constituting respective portions of the six series of through holes 107T. The six through holes 107T14 formed in the fifteenth dielectric layer 145 are respectively connected to the six through holes 107T16.

Further formed in the dielectric layer 146 are a plurality of through holes 163T16 constituting respective portions of the plurality of series of through holes 163T. All the through holes represented by circles in FIG. 28 except the through holes 146T1 and 107T16 are the through holes 163T16. The plurality of through holes 163T14 formed in the fifteenth dielectric layer 145 are respectively connected to the plurality of through holes 163T16.

FIG. 29 illustrates the second patterned surface of the sixteenth dielectric layer 146. On the second patterned surface of the dielectric layer 146, there are formed the conductor layer 1470 forming the second portion 162 of the shield 106, and a conductor layer 1471 forming the second input/output port 4. A circular hole 1470a is formed in the conductor layer 1470. The conductor layer 1471 is formed inside the hole 1470a and is not in contact with the conductor layer 1470.

The through hole 146T1 illustrated in FIG. 28 is connected to the conductor layer 1471. The through holes 107T16 and 163T16 illustrated in FIG. 28 are connected to the conductor layer 1470. A portion of the conductor layer 1461 near the second end 13Bb illustrated in FIG. 28 is opposed to the conductor layer 1470 with the dielectric layer 146 interposed therebetween.

The multilayered filter device 100 according to the present embodiment is constructed by stacking the first to sixteenth dielectric layers 131 to 146 with the patterned surface of the first dielectric layer 131 facing downward and the second patterned surface of the sixteenth dielectric layer 146 facing upward.

The respective resonator conductor portions 1510, 1520, 1530, 1540, 1550, and 1560 of the resonators 51 to 56 are located at the same position in the Z direction within the multilayer stack 102. In the present embodiment, as illustrated in FIG. 23, the shortest paths 51P and 56P of the resonator conductor portions 1510 and 1560 are shorter than the shortest paths 52P, 53P, 54P, and 55P of the resonator conductor portions 1520, 1530, 1540, and 1550 of the middle resonators 52 to 55.

Correspondences of the circuit components illustrated in FIG. 2 with the components of the multilayer stack 102 illustrated in FIG. 17 to FIG. 29 will now be described.

To begin with, a description will be given of the band pass filter 15. The conductor layer 1311 forming the first input/output port 3 is connected to the conductor layer 1381 illustrated in FIG. 22 via the through holes 131T1, 132T1, 133T1, 135T1 and 136T1 and the conductor layer 1351. The conductor layer 1381 is opposed to a portion of the resonator conductor portion 1510 near the first end 51a illustrated in FIG. 23, with the dielectric layer 138 interposed between the conductor layer 1381 and the resonator conductor portion 1510. The capacitor C1 illustrated in FIG. 2 is composed of the conductor layer 1381, the resonator conductor portion 1510, and the dielectric layer 138 interposed between the conductor layer 1381 and the resonator conductor portion 1510.

The conductor layer 1471 forming the second input/output port 4 is connected to the conductor layer 1401 illustrated in FIG. 24 via the through holes 146T1, 144T1, 143T1, 141T1 and 140T1 and the conductor layer 1431. The conductor layer 1401 is opposed to a portion of the resonator conductor portion 1560 near the first end 56a illustrated in FIG. 23, with the dielectric layer 139 interposed between the conductor layer 1401 and the resonator conductor portion 1560. The capacitor C2 illustrated in FIG. 2 is composed of the conductor layer 1401, the resonator conductor portion 1560, and the dielectric layer 139 interposed between the conductor layer 1401 and the resonator conductor portion 1560.

The conductor layer 1382 illustrated in FIG. 22 is opposed to a portion of the resonator conductor portion 1510 near the second end 51b and to a portion of the resonator conductor portion 1520 near the first end 52a, with the dielectric layer 138 interposed between the conductor layer 1382 and each of the resonator conductor portions 1510 and 1520. The capacitor C12 illustrated in FIG. 2 is composed of the conductor layer 1382, the resonator conductor portions 1510 and 1520, and the dielectric layer 138 interposed between the conductor layer 1382 and the resonator conductor portions 1510 and 1520.

The conductor layer 1383 illustrated in FIG. 22 is opposed to a portion of the resonator conductor portion 1520 near the second end 52b and to a portion of the resonator conductor portion 1530 near the first end 53a, with the dielectric layer 138 interposed between the conductor layer 1383 and each of the resonator conductor portions 1520 and 1530. The capacitor C23 illustrated in FIG. 2 is composed of the conductor layer 1383, the resonator conductor portions 1520 and 1530, and the dielectric layer 138 interposed between the conductor layer 1383 and the resonator conductor portions 1520 and 1530.

The conductor layer 1384 illustrated in FIG. 22 is opposed to the portion of the resonator conductor portion 1530 near the first end 53a and to a portion of the resonator conductor portion 1540 near the first end 54a, with the dielectric layer 138 interposed between the conductor layer 1384 and each of the resonator conductor portions 1530 and 1540. The capacitor C34 illustrated in FIG. 2 is composed of the conductor layer 1384, the resonator conductor portions 1530 and 1540, and the dielectric layer 138 interposed between the conductor layer 1384 and the resonator conductor portions 1530 and 1540.

The conductor layer 1385 illustrated in FIG. 22 is opposed to the portion of the resonator conductor portion 1540 near the first end 54a and to a portion of the resonator conductor portion 1550 near the second end 55b, with the dielectric layer 138 interposed between the conductor layer 1385 and each of the resonator conductor portions 1540 and 1550. The capacitor C45 illustrated in FIG. 2 is composed of the conductor layer 1385, the resonator conductor portions 1540 and 1550, and the dielectric layer 138 interposed between the conductor layer 1385 and the resonator conductor portions 1540 and 1550.

The conductor layer 1386 illustrated in FIG. 22 is opposed to a portion of the resonator conductor portion 1550 near the first end 55a and to a portion of the resonator conductor portion 1560 near the second end 56b, with the dielectric layer 138 interposed between the conductor layer 1386 and each of the resonator conductor portions 1550 and 1560. The capacitor C56 illustrated in FIG. 2 is composed of the conductor layer 1386, the resonator conductor portions 1550 and 1560, and the dielectric layer 138 interposed between the conductor layer 1386 and the resonator conductor portions 1550 and 1560.

Figure 16:
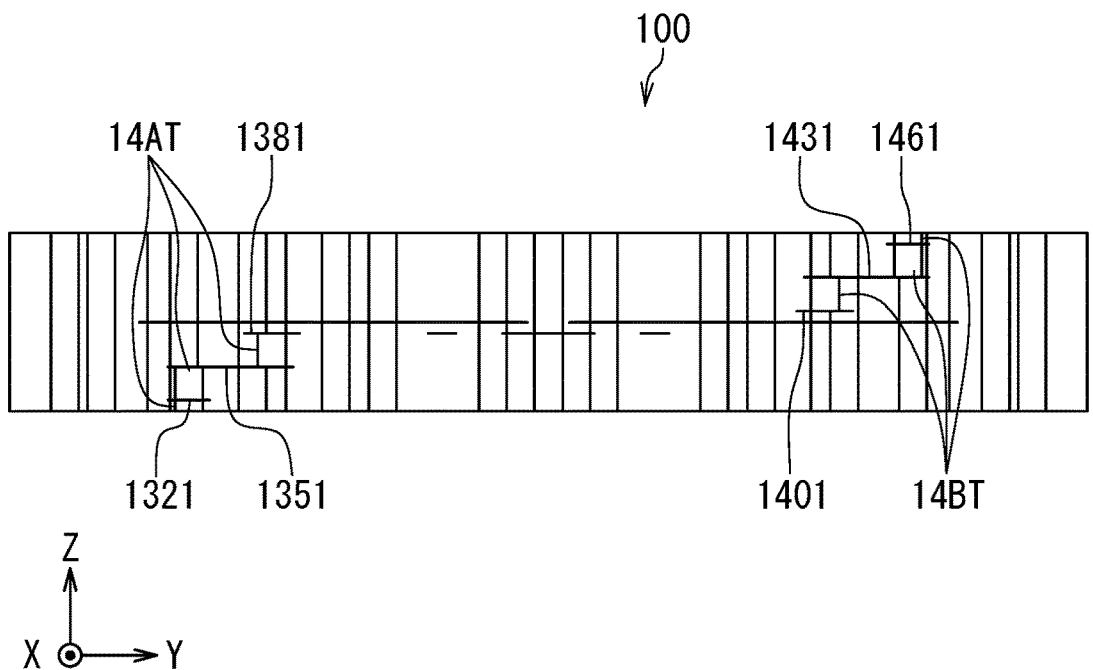
FIG. 16 is a cross-sectional view of the multilayered filter device according to the second embodiment of the invention.

Next, the first band elimination filter 10A will be described also with reference to FIG. 16. FIG. 16 is a cross-sectional view of the multilayered filter device 100. The connection path 11A and the impedance transformer 14A illustrated in FIG. 2 are formed of the through holes 131T1, 132T1, 133T1, 135T1 and 136T1 and the conductor layer 1351. The impedance transformer 14A includes the through hole line portion 14AT illustrated in FIG. 16. The through hole line portion 14AT includes the through holes 131T1, 132T1, 133T1, 135T1, and 136T1.

The conductor line 13A constituting the resonator 12A is formed of the conductor layer 1321 illustrated in FIG. 18. The position where the conductor layer 1321 and the through hole 132T1 are connected corresponds to the first end 13Aa of the conductor line 13A. As illustrated in FIG. 18, the second end 13Ab of the conductor line 13A is an end of the conductor layer 1321 farthest from the position where the conductor layer 1321 and the through hole 132T1 are connected. The distance from the first end 13Aa to the second end 13Ab of the conductor line 13A has a value equal to or nearly equal to a quarter of the wavelength corresponding to the center frequency of the stopband of the first band elimination filter 10A.

Next, the second band elimination filter 10B will be described. The connection path 11B and the impedance transformer 14B illustrated in FIG. 2 are formed of the through holes 146T1, 144T1, 143T1, 141T1 and 140T1 and the conductor layer 1431. The impedance transformer 14B includes the through hole line portion 14BT illustrated in FIG. 16. The through hole line portion 14BT includes the through holes 146T1, 144T1, 143T1, 141T1, and 140T1.

The conductor line 13B constituting the resonator 12B is formed of the conductor layer 1461 illustrated in FIG. 28. The position where the conductor layer 1461 and the through hole 146T1 are connected corresponds to the first end 13Ba of the conductor line 13B. As illustrated in FIG. 28, the second end 13Bb of the conductor line 13B is an end of the conductor layer 1461 farthest from the position where the conductor layer 1461 and the through hole 146T1 are connected. The distance from the first end 13Ba to the second end 13Bb of the conductor line 13B has a value equal to or nearly equal to a quarter of the wavelength corresponding to the center frequency of the stopband of the second band elimination filter 10B.

Next, the coupling adjustment section 107 and the shield 106 will be described. The coupling adjustment section 107 is formed of the six series of through holes 107T. The six series of through holes 107T are each constituted of the through holes 107T1, 107T2, 107T3, 107T5, 107T6, 107T8, 107T9, 107T10, 107T11, 107T13, 107T14, and 107T16 connected in series in the Z direction.

The shield 106 includes the first portion 161, the second portion 162, and the connecting portion 163. The first portion 161 is formed of the conductor layer 1310. The second portion 162 is formed of the conductor layer 1470. The connecting portion 163 includes the plurality of series of through holes 163T. The plurality of series of through holes 163T are each constituted of the through holes 163T1, 163T2, 163T3, 163T5, 163T6, 163T8, 163T9, 163T10, 163T11, 163T13, 163T14, and 63T16 connected in series in the Z direction.

In the multilayered filter device 100 according to the present embodiment, the first input/output port 3 is disposed on the first end face 102A of the multilayer stack 102 and the second input/output port 4 is disposed on the second end face 102B of the multilayer stack 102. Thus, in the present embodiment, other electronic components to be connected to the second input/output port 4 can be stacked on the multilayer stack 102. This makes it possible to reduce the footprint of the multilayered filter device 100 and the other electronic components on a substrate to which the multilayered filter device 100 and the other electronic components are to be mounted.

The configuration, function and effects of the present embodiment are otherwise the same as those of the first embodiment.

The present invention is not limited to the foregoing embodiments, and various modifications may be made thereto. For example, the multilayered filter device of the present invention may include only either the first or second band elimination filter 10A or 10B as the band elimination filter. The multilayered filter device of the present invention may also include additional components aside from the band pass filter and the band elimination filter. Examples of such additional components include a filter other than a band pass or band elimination filter, and a circuit having a function other than a filter.

Obviously, many modifications and variations of the present invention are possible in the light of the above teachings. Thus, it is to be under stood that, within the scope of the appended claims and equivalents thereof, the invention may be practiced in other embodiments than the foregoing most preferable embodiments.

What is claimed is:

1. A multilayered filter device comprising:
   a multilayer stack including a plurality of dielectric layers and a plurality of conductor layers stacked together;
   a first input/output port and a second input/output port integrated with the multilayer stack; and
   a filter and a band elimination filter each constructed using the multilayer stack and provided between the first input/output port and the second input/output port in circuit configuration, wherein
   the filter includes at least one first resonator, the at least one first resonator being an LC resonator,
   the band elimination filter includes:
      a first input/output;
      a second input/output;
      a connection path connecting the first input/output and the second input/output, and
      a second resonator coupled to the connection path,
   the connection path includes an impedance transformer,
   the second resonator includes a conductor line constituting a distributed constant line, and
   the band elimination filter causes an insertion loss at a frequency twice as high as a center frequency of a passband of the filter to be higher than in a case without the band elimination filter in a frequency response of insertion loss between the first input/output port and the second input/output port.

2. The multilayered filter device according to claim 1, wherein
   the impedance transformer includes a through hole line portion, and
   the through hole line portion includes at least one through hole provided in the multilayer stack.

3. The multilayered filter device according to claim 1, wherein the conductor line has a first end directly connected to the connection path, and a second end farthest from the connection path in circuit configuration.

4. The multilayered filter device according to claim 3, wherein the second end of the conductor line is open.

5. The multilayered filter device according to claim 1, wherein
the filter includes, as the at least one first resonator, a plurality of first resonators configured so that every two of the first resonators adjacent to each other in circuit configuration are electromagnetically coupled to each other,
each of the plurality of first resonators includes a resonator conductor portion formed of a line of conductor, and
the resonator conductor portion includes a first end and a second end which are opposite ends of the line and are open.

6. The multilayered filter device according to claim 5, wherein
the plurality of first resonators include a first input/output stage resonator closest to the first input/output port in circuit configuration, a second input/output stage resonator closest to the second input/output port in circuit configuration, and at least one middle resonator located between the first input/output stage resonator and the second input/output stage resonator in circuit configuration, and
the first and second input/output stage resonators are each smaller in length of a shortest path connecting the first end and the second end of the resonator conductor portion than the at least one middle resonator.

7. A multilayered filter device comprising:
a multilayer stack including a plurality of dielectric layers and a plurality of conductor layers stacked together;
a first input/output port and a second input/output port integrated with the multilayer stack; and
a filter and a band elimination filter each constructed using the multilayer stack and provided between the first input/output port and the second input/output port in circuit configuration, wherein
the filter includes at least one first resonator, the at least one first resonator being an LC resonator,
the band elimination filter includes:
a first input/output;
a second input/output;
a connection path connecting the first input/output and the second input/output, and
a second resonator coupled to the connection path,
the connection path includes an impedance transformer,
the impedance transformer includes a through hole line portion,
the through hole line portion includes at least one through hole provided in the multilayer stack, and
the second resonator includes a conductor line constituting a distributed constant line.

8. The multilayered filter device according to claim 7, wherein the band elimination filter causes an insertion loss at a frequency twice as high as a center frequency of a passband of the filter to be higher than in a case without the band elimination filter in a frequency response of insertion loss between the first input/output port and the second input/output port.

9. The multilayered filter device according to claim 7, wherein the conductor line has a first end directly connected to the connection path, and a second end farthest from the connection path in circuit configuration.

10. The multilayered filter device according to claim 9, wherein the second end of the conductor line is open.

11. The multilayered filter device according to claim 7, wherein
the filter includes, as the at least one first resonator, a plurality of first resonators configured so that every two of the first resonators adjacent to each other in circuit configuration are electromagnetically coupled to each other,
each of the plurality of first resonators includes a resonator conductor portion formed of a line of conductor, and
the resonator conductor portion includes a first end and a second end which are opposite ends of the line and are open.

12. The multilayered filter device according to claim 11, wherein
the plurality of first resonators include a first input/output stage resonator closest to the first input/output port in circuit configuration, a second input/output stage resonator closest to the second input/output port in circuit configuration, and at least one middle resonator located between the first input/output stage resonator and the second input/output stage resonator in circuit configuration, and
the first and second input/output stage resonators are each smaller in length of a shortest path connecting the first end and the second end of the resonator conductor portion than the at least one middle resonator.

13. A multilayered filter device comprising:
a multilayer stack including a plurality of dielectric layers and a plurality of conductor layers stacked together;
a first input/output port and a second input/output port integrated with the multilayer stack; and
a filter and a band elimination filter each constructed using the multilayer stack and provided between the first input/output port and the second input/output port in circuit configuration, wherein
the filter includes at least one first resonator, the at least one first resonator being an LC resonator,
the band elimination filter includes:
a first input/output;
a second input/output;
a connection path connecting the first input/output and the second input/output, and
a second resonator coupled to the connection path,
the connection path includes an impedance transformer,
the second resonator includes a conductor line constituting a distributed constant line, and
the conductor line has a first end directly connected to the connection path, and a second end farthest from the connection path in circuit configuration.

14. The multilayered filter device according to claim 13, wherein the band elimination filter causes an insertion loss at a frequency twice as high as a center frequency of a passband of the filter to be higher than in a case without the band elimination filter in a frequency response of insertion loss between the first input/output port and the second input/output port.

15. The multilayered filter device according to claim 13, wherein
the impedance transformer includes a through hole line portion, and
the through hole line portion includes at least one through hole provided in the multilayer stack.

16. The multilayered filter device according to claim 13, wherein the second end of the conductor line is open.

17. The multilayered filter device according to claim 13, wherein the filter includes, as the at least one first resonator, a plurality of first resonators configured so that every two of the first resonators adjacent to each other in circuit configuration are electromagnetically coupled to each other, each of the plurality of first resonators includes a resonator conductor portion formed of a line of conductor, and the resonator conductor portion includes a first end and a second end which are opposite ends of the line and are open.

18. The multilayered filter device according to claim 17, wherein the plurality of first resonators include a first input/output stage resonator closest to the first input/output port in circuit configuration, a second input/output stage resonator closest to the second input/output port in circuit configuration, and at least one middle resonator located between the first input/output stage resonator and the second input/output stage resonator in circuit configuration, and the first and second input/output stage resonators are each smaller in length of a shortest path connecting the first end and the second end of the resonator conductor portion than the at least one middle resonator.

19. A multilayered filter device comprising:

a multilayer stack including a plurality of dielectric layers and a plurality of conductor layers stacked together;

a first input/output port and a second input/output port integrated with the multilayer stack; and a filter and a band elimination filter each constructed using the multilayer stack and provided between the first input/output port and the second input/output port in circuit configuration, wherein the filter includes a plurality of first resonators, the plurality of first resonators each being an LC resonator, the plurality of first resonators are configured so that every two of the first resonators adjacent to each other in circuit configuration are electromagnetically coupled to each other, each of the plurality of first resonators includes a resonator conductor portion formed of a line of conductor, the resonator conductor portion includes a first end and a second end which are opposite ends of the line and are open, the band elimination filter includes:
  a first input/output;
  a second input/output;
  a connection path connecting the first input/output and the second input/output, and
  a second resonator coupled to the connection path, the connection path includes an impedance transformer, and the second resonator includes a conductor line constituting a distributed constant line.

20. The multilayered filter device according to claim 19, wherein the band elimination filter causes an insertion loss at a frequency twice as high as a center frequency of a passband of the filter to be higher than in a case without the band elimination filter in a frequency response of insertion loss between the first input/output port and the second input/output port.

21. The multilayered filter device according to claim 19, wherein the impedance transformer includes a through hole line portion, and the through hole line portion includes at least one through hole provided in the multilayer stack.

22. The multilayered filter device according to claim 19, wherein the conductor line has a first end directly connected to the connection path, and a second end farthest from the connection path in circuit configuration.

23. The multilayered filter device according to claim 22, wherein the second end of the conductor line is open.

24. The multilayered filter device according to claim 19, wherein the plurality of first resonators include a first input/output stage resonator closest to the first input/output port in circuit configuration, a second input/output stage resonator closest to the second input/output port in circuit configuration, and at least one middle resonator located between the first input/output stage resonator and the second input/output stage resonator in circuit configuration, and the first and second input/output stage resonators are each smaller in length of a shortest path connecting the first end and the second end of the resonator conductor portion than the at least one middle resonator.

25. A multilayered filter device comprising:

a multilayer stack including a plurality of dielectric layers and a plurality of conductor layers stacked together;

a first input/output port and a second input/output port integrated with the multilayer stack; and a filter and a band elimination filter each constructed using the multilayer stack and provided between the first input/output port and the second input/output port in circuit configuration, wherein the filter selectively passes signals within a passband greater than or equal to a first frequency and less than or equal to a second frequency, and includes at least one first resonator, the at least one first resonator being an LC resonator, the first and second frequencies are two frequencies at which an insertion loss is higher by a predetermined magnitude than a minimum value of the insertion loss in a frequency response of insertion loss between the first input/output port and the second input/output port, in the frequency response, an insertion loss in a frequency band less than the first frequency is higher than an insertion loss in the first frequency, in the frequency response, an insertion loss in a frequency band greater than the second frequency is higher than an insertion loss in the second frequency, the band elimination filter includes:
  a first input/output;
  a second input/output;
  a connection path connecting the first input/output and the second input/output, and
  a second resonator coupled to the connection path, the connection path includes an impedance transformer, and the second resonator includes a conductor line constituting a distributed constant line.

* * * * *